US006995426B2

(12) United States Patent
Okumura et al.

(10) Patent No.: US 6,995,426 B2
(45) Date of Patent: Feb. 7, 2006

(54) SEMICONDUCTOR DEVICE HAVING VERTICAL METAL INSULATOR SEMICONDUCTOR TRANSISTORS HAVING PLURAL SPATIALLY OVERLAPPING REGIONS OF DIFFERENT CONDUCTIVITY TYPE

(75) Inventors: Hideki Okumura, Yokohama (JP); Hitoshi Kobayashi, Yokohama (JP); Masanobu Tsuchitani, Kawasaki (JP); Akihiko Osawa, Himeji (JP); Wataru Saito, Kawasaki (JP); Masakazu Yamaguchi, Kawasaki (JP); Ichiro Omura, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/327,937

(22) Filed: Dec. 26, 2002

(65) Prior Publication Data

US 2003/0122222 A1 Jul. 3, 2003

(30) Foreign Application Priority Data

Dec. 27, 2001 (JP) ............................ 2001-395558

(51) Int. Cl.
*H01L 29/76* (2006.01)
*H01L 29/94* (2006.01)
*H01L 31/062* (2006.01)
*H01L 31/113* (2006.01)
*H01L 31/119* (2006.01)

(52) U.S. Cl. ....................... 257/341; 257/342; 257/401

(58) Field of Classification Search ................ 257/110, 257/120, 132, 133, 140–147, 192, 213, 342, 257/379, 341, 401; 438/510–541
See application file for complete search history.

(56) References Cited

U.S. PATENT DOCUMENTS 4,901,127 A * 2/1990 Chow et al. ................ 257/378
5,198,688 A * 3/1993 Tsuchiya et al. ............ 257/144
5,216,275 A 6/1993 Chen
5,572,055 A * 11/1996 Sumida ...................... 257/343
5,665,988 A * 9/1997 Huang ........................ 257/133
5,705,835 A * 1/1998 Nishiura et al. ............ 257/147
5,952,701 A * 9/1999 Bulucea et al. ............. 257/407

(Continued)

FOREIGN PATENT DOCUMENTS

JP 07135307 A * 5/1995

(Continued)

OTHER PUBLICATIONS

Y. Onishi et al., "24mΩcm$^2$ 680V Silicon Superjunction Mosfet", Proc. ISPSD, 2002, pp. 241-244.

(Continued)

*Primary Examiner*—Amir Zarabian
*Assistant Examiner*—Monica Lewis
(74) *Attorney, Agent, or Firm*—Oblon, Spivak, McClelland, Maier & Neustadt, P.C.

(57) ABSTRACT

A semiconductor device includes a diffusion area formed in a semiconductor layer of a first conductive type. The diffusion area comprises first and second impurity diffusion areas of the first and second conductive types, respectively. The diffusion area has a first and second areas which are defined by an impurity concentration of the first and second impurity diffusion areas. A junction between the first and second area is formed in a portion in which the first and second impurity diffusion areas overlap each other. A period of the impurity concentration, in a planar direction of the semiconductor layer, of the first or second area is smaller than the maximum width, in the planar direction of the semiconductor layer, of the first and second impurity diffusion areas constituting the first or second area.

16 Claims, 17 Drawing Sheets

U.S. PATENT DOCUMENTS

| | | | |
|---|---|---|---|
| 6,037,632 | A | 3/2000 | Omura et al. |

FOREIGN PATENT DOCUMENTS

| | | |
|---|---|---|
| JP | 2000-40822 | 2/2000 |
| JP | 2000-208527 | 7/2000 |

OTHER PUBLICATIONS

U.S. Appl. No. 10/327,937, filed Dec. 26, 2002, Okumura et al.

U.S. Appl. No. 10/403,122, filed Apr. 01, 2003, Yamaguchi et al.

* cited by examiner

SEMICONDUCTOR DEVICE HAVING VERTICAL METAL INSULATOR SEMICONDUCTOR TRANSISTORS HAVING PLURAL SPATIALLY OVERLAPPING REGIONS OF DIFFERENT CONDUCTIVITY TYPE

CROSS-REFERENCE TO RELATED APPLICATIONS

This application is based upon and claims the benefit of priority from the prior Japanese Patent Application No. 2001-395558, filed Dec. 27, 2001, the entire contents of which are incorporated herein by reference.

BACKGROUND OF THE INVENTION

1. Field of the Invention

The present invention relates to a substrate structure of a semiconductor device having vertical power MISFETs (Metal Insulator Field Effect Transistors) each having a gate electrode formed on a semiconductor substrate, as well as a method of manufacturing this substrate structure.

2. Description of the Related Art

In a vertical power MIS (including a MOS (Metal Oxide Semiconductor) FET formed on a semiconductor substrate, a drain current flows between a source and drain electrodes formed on a top and bottom surfaces, respectively, of a semiconductor substrate. Such an element allows the resistance of a current passage to be reduced and is thus often used as a power device.

FIG. 34 shows the sectional structure of a super junction type MISFET currently put to practical use. A semiconductor substrate 100 is composed of a first semiconductor substrate and a second semiconductor substrate consisting of an epitaxial growth layer. The first semiconductor substrate, which functions as an $N^+$ drain area 101, contacts with a drain electrode 105. The second semiconductor substrate, which functions as $N^-$ drain areas 102, is provided with first P base areas 103.

Second P base areas 106, which contact with the first P base areas 103, are formed under a surface of the second semiconductor substrate. Reference numerals 107, 108, 109, and 110 denote an N source area, a gate insulating film, a gate area, and a source area.

The width of the P base area 103 and the $N^-$ drain area 102 located between the P base areas 103 (a P and N type pillar layers, respectively) and the amounts of P and N type impurities contained in these areas are optimally designed. Thus, if a reverse bias voltage is applied to the MISFET, the P and N type pillar layers are depleted. This structure enables on resistance to be reduced compared to other vertical MISFETs.

Other known examples of a MISFET improved so as to reduce the on resistance is described in U.S. Pat. No. 5,216,275 and Jpn. Pat. Appln. KOKAI Publication No. 2000-40822. In This U.S. Patent pillar-like P-type areas (corresponding to 103 in FIG. 34 of the specification) connected to base areas are formed of trenches as shown in FIG. 2 or the like. However, this patent does not clearly state that it can completely deplete the pillar layers and reduce the on resistance. Further, the latter publication describes the formation of both P and N layers in a drift layer by diffusion. However, a non-diffusion area remains between the P and N layers. That is, an area with a low concentration remains in a substrate. Accordingly, in this structure, the maximum width of a first or second diffusion area is larger than the thickness of a single epitaxial growth layer. Thus, this patent fails to form a fine structure in a substrate planar direction and thus does not serve to reduce the on resistance.

The structure shown in FIG. 34 is formed as follows: First, a P type impurity diffusion area is formed in a first epitaxial growth layer formed on the first semiconductor substrate. Then, a P type impurity diffusion area is formed in a second epitaxial growth layer formed on the first epitaxial growth layer. This step is repeated for about five to seven layers. Then, the P type impurities in the epitaxial growth layers are thermally diffused and thus connected together in a depth direction to form the first P base area 103. At this time, adjacent P impurity diffusion areas must be formed at a specified distance so as not to be joined together.

A MISFET having the structure shown in FIG. 34 allows the concentration of impurities to be increased by reducing the widths of the P and N type pillar layers. This enables the on resistance to be further reduced. However, to reduce the widths of the pillar layers, it is necessary to join the impurity diffusion areas 102 together lengthwise with a small amount of diffusion. As a result, the number of epitaxial growth layers (102*a* to 102*k*) increases as shown in FIG. 35, thus increasing manufacturing costs.

Further, the manufacturing costs can be cut down by reducing the number of epitaxial growth layers. However, in this case, the diffusion areas 120 must be enlarged as shown in FIG. 36. Thus, the width of the pillar layers increases, and the concentration of impurities decreases. This may degrade the on resistance.

The present invention is provided in view of these circumstances. It is an object of the present invention to provide a semiconductor device having a drift area structure with a reduced pitch between each area (P type area) exhibiting the same polarity as that of a P type and a corresponding area (N type area) exhibiting the same polarity as that of an N type and terminal area structure, in order to form MISFET elements having a fine structure and achieve complete depletion.

BRIEF SUMMARY OF THE INVENTION

According to a first aspect of the present invention, there is provided a semiconductor device comprising a semiconductor layer of a first conductive type and a diffusion area formed the semiconductor layer, the diffusion area comprising first impurity diffusion areas of the first conductive type and second impurity diffusion areas of a second conductive type which are alternately formed, the diffusion area having first areas of the first conductive type and second areas of the second conductive type which are defined by the impurity concentrations of the first and second impurity diffusion areas, respectively, wherein a junction between each of the first areas and the corresponding second area is formed in a portion in which the corresponding first and second impurity diffusion areas overlap each other, and the period of the impurity concentration, in a planar direction of the semiconductor layer, of the areas selected from a group consisting of the first and second areas is smaller than the maximum width, in the planar direction of the semiconductor layer, of the first and second impurity diffusion areas constituting the selected areas.

According to a second aspect of the present invention, there is provided a method of manufacturing a semiconductor device, the method comprising injecting first impurities of a first conductive type and second impurities of a second conductive type into a surface of a semiconductor layer of a first conductive type; and diffusing the first and second impurities to form a diffusion area, the diffusion area having a first area and a second area, the first and second areas defined by an impurity concentration of a first impurity diffusion area of the first conductive type and a second impurity diffusion area of the second conductive type, the first and second impurity diffusion area overlapping each other, and a period of the impurity concentration, in a planar direction of the semiconductor layer, of an area selected from a group consisting of the first and second areas being smaller than the maximum width, in the planar direction of the semiconductor layer, of the first and second impurity diffusion areas constituting the selected areas.

DETAILED DESCRIPTION OF THE INVENTION

Figure 1:
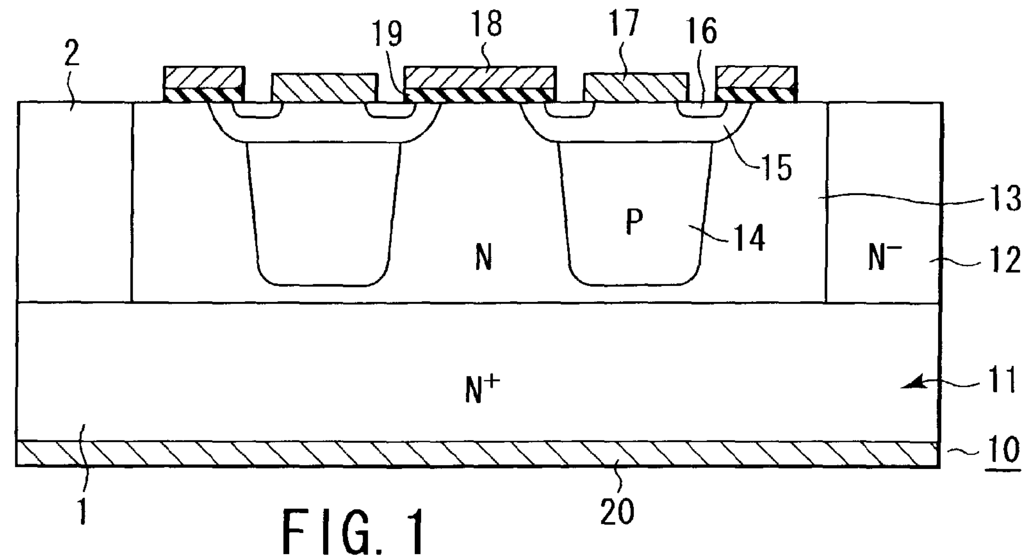
FIG. 1 is a diagram showing the sectional structure of a semiconductor device according to a first embodiment of the present invention.

Embodiments of the present invention will be described below with reference to the drawings. In the description below, components having substantially the same functions and configurations are denoted by the same reference numerals. Duplicate description will be given only when required.

(First Embodiment)

A first embodiment will be described with reference to FIGS. 1 to 12.

FIG. 1 is a diagram showing the sectional structure of a semiconductor device according to the first embodiment of the present invention. This semiconductor device is a vertical MISFET in which PN junctions are formed to extend in a depth direction. In each of the embodiments described below, for example, a first conductive type is N and, whereas a second conductive type is P.

As shown in FIG. 1, a semiconductor substrate (layer) 10 consisting of, for example, silicon is composed of a first semiconductor substrate 1 and a second semiconductor substrate 2. The first semiconductor substrate 1 has impurities of a high concentration and an N type conductivity. The second semiconductor substrate 2 is formed on the first semiconductor substrate 1 and has an N type conductivity with an impurity concentration lower than that of the first semiconductor substrate 1. The second semiconductor substrate 2 may be, for example, a single epitaxial layer.

An $N^+$ drain area 11 is formed in the first semiconductor substrate 1. The $N^+$ drain area 11 is connected to a drain area 20 formed on a back surface of the first semiconductor substrate 1.

An $N^-$ drain area 12 which contacts with the $N^+$ drain area 11 is formed in the second semiconductor substrate 2. An impurity diffusion area is formed in the $N^-$ drain area 12 by diffusing impurities and has an impurity concentration higher than that of the second semiconductor substrate 2. This impurity diffusion area is composed of first diffusion areas 13 and second diffusion areas 14 formed inside the first diffusion area 13. The first diffusion areas 13 have the same polarity as that of the N type. The second diffusion areas 14 have the same polarity as that of the P type. The end of each of the second diffusion areas 14 is adjacent to the corresponding first diffusion area 13. The junction between each of the first diffusion areas 13 and the corresponding second diffusion area 14 in a substrate planar direction is perpendicular to the substrates.

N and P type impurities are mixed in the first and second diffusion areas 13 and 14. In each portion of the impurity diffusion area, the concentrations of these impurities define the first or second diffusion areas 13 or 14 as described below in detail. There are differences in impurity concentration among the portions of the first and second diffusion areas 13 and 14. However, in terms of an average value, the impurity concentration of the second semiconductor substrate 2 is set to be greatly lower than those of the first and second diffusion areas 13 and 14. More specifically, the impurity concentrations are set so that the concentration in the second semiconductor substrate is equal to or smaller than one-fifths of those in the first and second diffusion areas 13 and 14. Preferably, the concentration in the second semiconductor area 2 is one-two-hundredth to one-fifth and more preferably one-one-hundredth to one-fifth of those in the first and second diffusion areas.

The first diffusion areas 13 each function as an N drain area. The second diffusion areas 14 each function as a first P base area.

Second P base areas 15 are formed on a surface of the semiconductor substrate 10 which is located on the respective first P base area (second diffusion area) 14. The second P base areas 15 are connected to the respective first P base areas 14 and formed by diffusing impurities. N source areas 16 are formed inside each of the P base areas 15. The first diffusion areas 13, the second P base areas 15, and the N source areas 16 are exposed from a main surface of the semiconductor substrate 10 (the $N^-$ drain areas 12 is normally passivated by an oxide film).

Gate electrodes 18 are each formed on the main surface of the semiconductor substrate 10 via a gate insulating film 19 such as a silicon oxide film. The gate insulating film 19 and the gate electrode 18 cover a part of the second P base area 15 and areas extending from the second P base area 15 to the N drain area 13 and the N source area 16. Source-base leader electrodes (hereinafter referred to as "source electrodes") 17 are formed on the main surface of the semiconductor substrate 10. The source electrodes 17 each have a central portion formed on the P base area 15 and opposite ends each covering a part of the N source area 16.

Figure 2:
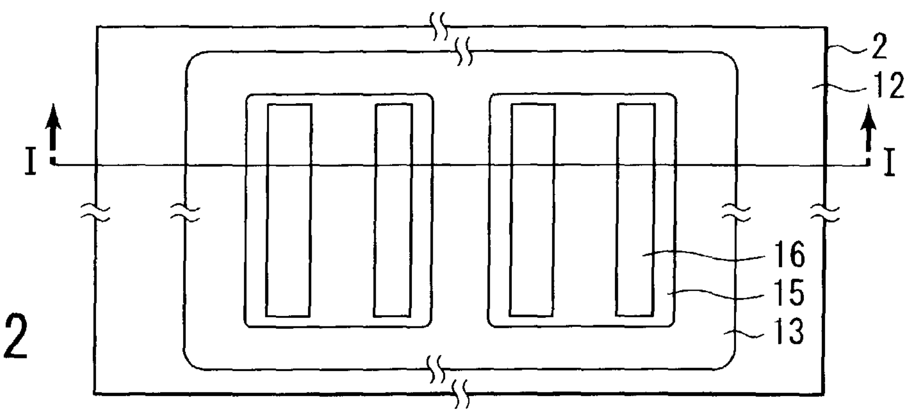
FIGS. 2 and 3 are plan views of a surface of the semiconductor substrate shown in FIG. 1.
Figure 3:
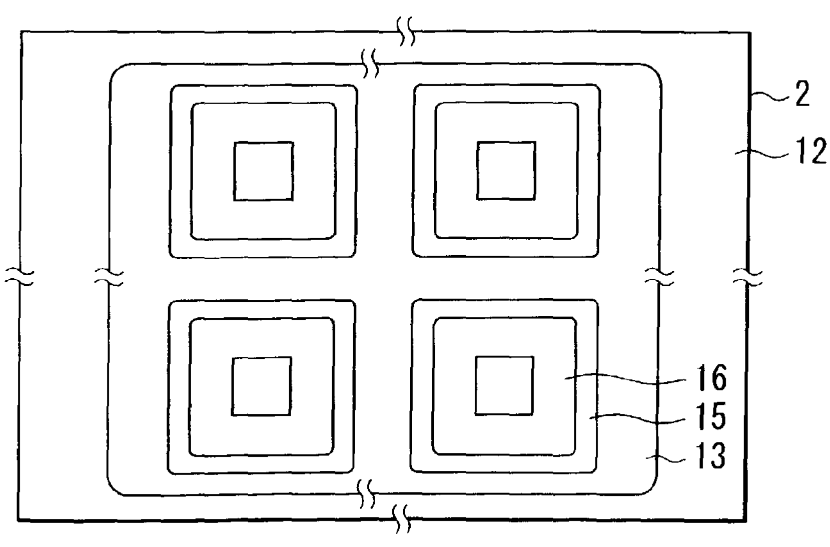

FIGS. 2 and 3 are plan views of the structures of MISFET elements formed on a surface area of the semiconductor substrate 10. In these figures, the gate electrodes and the source electrodes are omitted. FIG. 1 is a sectional view of a portion of the semiconductor device taken along the line I—I in FIG. 2. In the example shown in FIG. 2, lengthwise long MISFET elements (in FIG. 2, two) are formed in the semiconductor substrate. Further, in the example shown in FIG. 3, MISFET elements have a substantially square planar shape and are arranged on the semiconductor substrate 10 in a matrix. The sectional structure is the same as that shown in FIG. 1.

Figure 4:
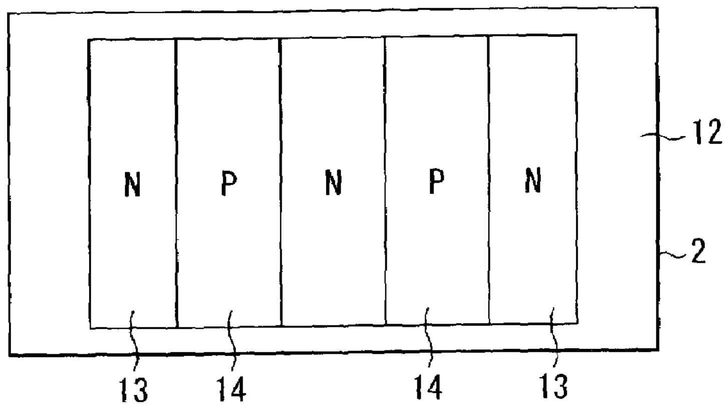
FIGS. 4 and 5 are plan views of a second semiconductor substrate on which a vertical MISFET, shown in FIG. 2 is formed.
Figure 5:
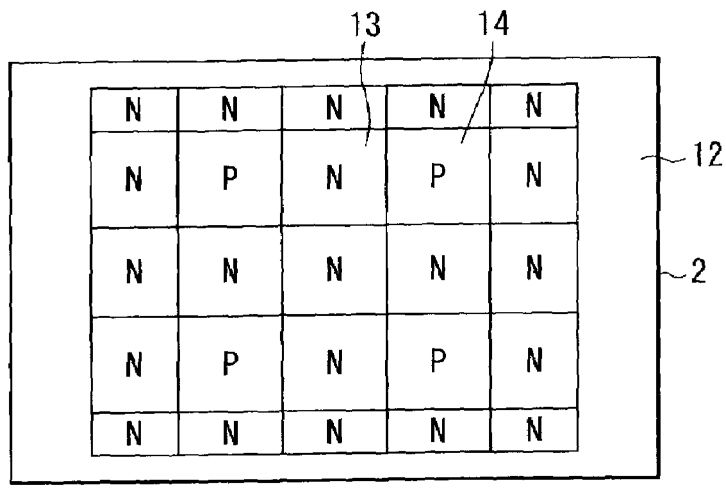

FIGS. 4 and 5 are plan views of a substrate surface illustrating the diffusion areas formed in the second semiconductor substrate 2. FIG. 4 corresponds to FIG. 2, and FIG. 5 corresponds to FIG. 3. As shown in FIG. 4, the first diffusion area 13 and 14 are arranged adjacent to each other in the $N^-$ drain area 12, constituting the second semiconductor substrate 2. The adjacent first and second diffusion areas 13 and 14 form a junction lengthwise in the plane of the semiconductor substrate 10. Further, as shown in FIG. 5, the first and second diffusion areas 13 and 14 have a substantially square planar shape. The first and second diffusion areas 13 and 14 are alternately arranged lengthwise and breadthwise within the $N^-$ drain area 12. The second diffusion areas 14 are each surrounded by the first diffusion areas 13. The junction between the second diffusion area 14 and the adjacent first diffusion area 13 is formed along the periphery of the second diffusion area 14.

Figure 6:
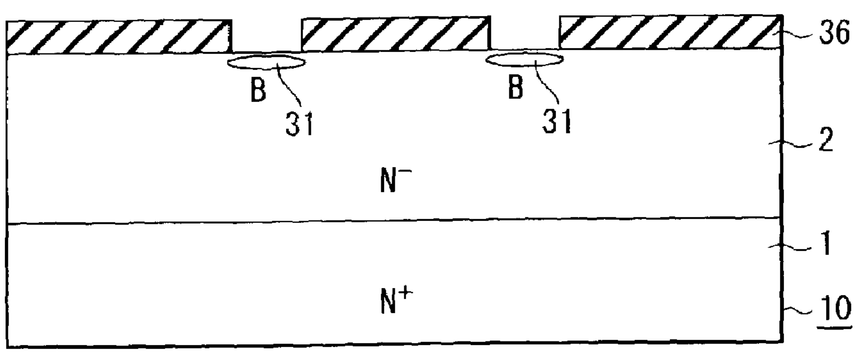
FIGS. 6 to 9 are diagrams illustrating first and second diffusion layers 13 and 14, shown in FIG. 1, and a method of manufacturing the same.

Now, the first and second diffusion areas 13 and 14 will be described below in detail with reference to FIGS. 6 to 9. FIGS. 6 to 9 illustrate the first and second diffusion layers 13 and 14 in FIG. 1 and a method of manufacturing the same. A method of forming these portions will also described. First, as shown in FIG. 6, the second semiconductor substrate 2 is formed on the first semiconductor substrate 1. Then, a photo resist 36 is formed on a surface of the second semiconductor substrate 2. Then, a photolithography step and an etching technique are used, forming openings in the photo resist 36 at positions corresponding to those at which boron injection areas 31 are to be formed. The diameter of these openings is determined by the widths of the first and second diffusion areas 13 and 14 and the like. The appropriate diameter is, for example, between about 0.3 and 2.0 μm. Further, the appropriate pitch of the openings is, for example, between about 6 and 18 μm. Then, boron (P type impurities) ions are injected through these openings at a dose Qd of 2 to $10\times10^{13}$ $cm^{-2}$. As a result, the boron injection areas 31 are formed at the predetermined positions of a surface area of the second semiconductor substrate 2.

Figure 7:
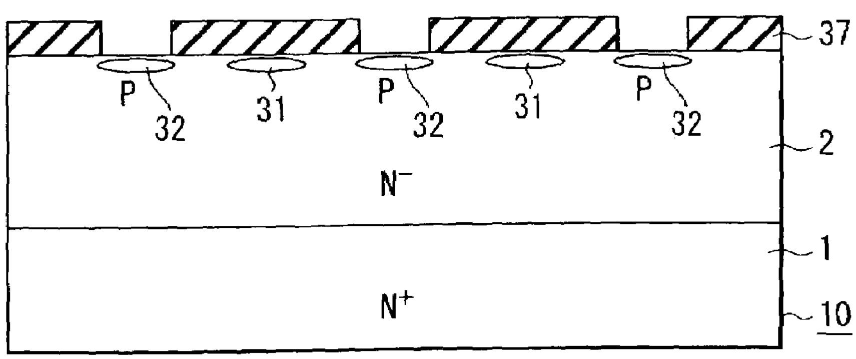

Then, as shown in FIG. 7, the photo resist 36 is removed. A photo resist 37 is then formed on the surface of the semiconductor substrate 2. Then, a photolithography step and an etching technique are used, forming openings each of which is located between the areas in which the boron injection areas 31 are formed. The diameter of these openings is determined by the widths of the first and second diffusion areas 13 and 14 and the like. The appropriate diameter is, for example, between about 0.3 and 2.0 μm. Further, the appropriate pitch of the openings is, for example, between about 6 and 18 μm. Then, phosphorus (N type impurities) ions are injected through these openings at a dose Qd of 2 to $10\times10^{13}$ $cm^{-2}$. As a result, the phosphorus injection areas 32 are formed at the predetermined positions of the surface area of the second semiconductor substrate 2. This processing allows the boron injection areas 31 and the phosphorous injection areas 32 to be formed in the surface area of the second semiconductor substrate 2 so as to be alternately arranged. When the photo resist is formed, a thin oxide film may be formed between the photo resist and the silicon.

Figure 8:
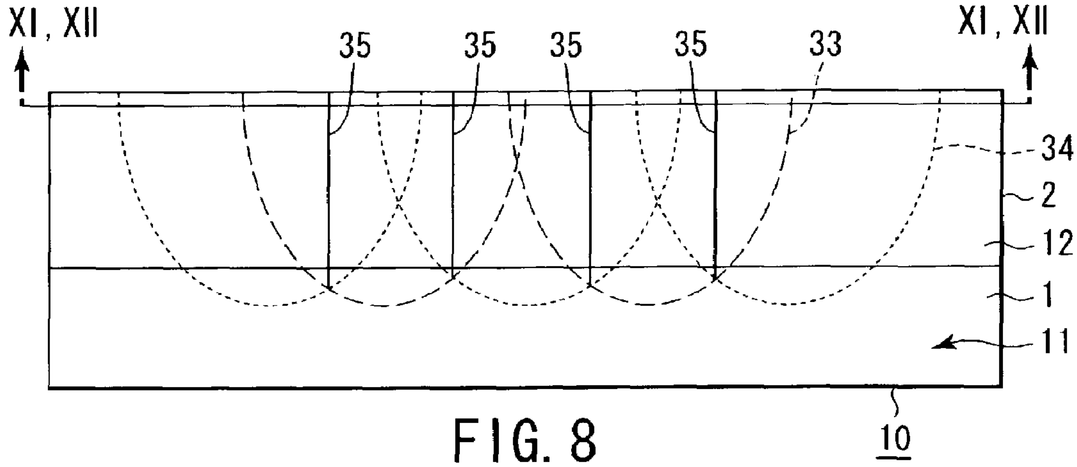
Figure 9:
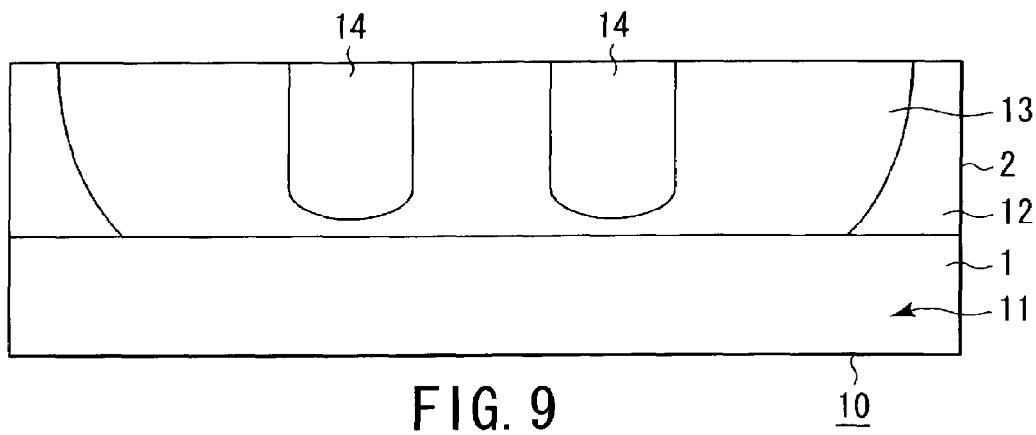

Then, as shown in FIG. 8, the semiconductor substrate 10 is thermally treated, diffusing the boron and phosphorous in the boron injection areas 31 and the phosphorous injection areas 32, respectively. As a result, boron diffusion areas 33 and phosphorous diffusion areas 34 are formed. At this time, junctions 35 are each formed in the center of an overlapping portion of the corresponding boron diffusion area 33 and phosphorous diffusion area 34 in a direction perpendicular to the substrate. As a result, as shown in FIG. 9, the first and second diffusion areas 13 and 14 are formed. The junction 35 is formed at a middle position between the each center or the phosphorous diffusion area 34 and the adjacent boron diffusion area 33 and the smaller a cell pitch becomes, the closer the junction 35 becomes to a center of the first and second diffusion areas.

Figure 10:
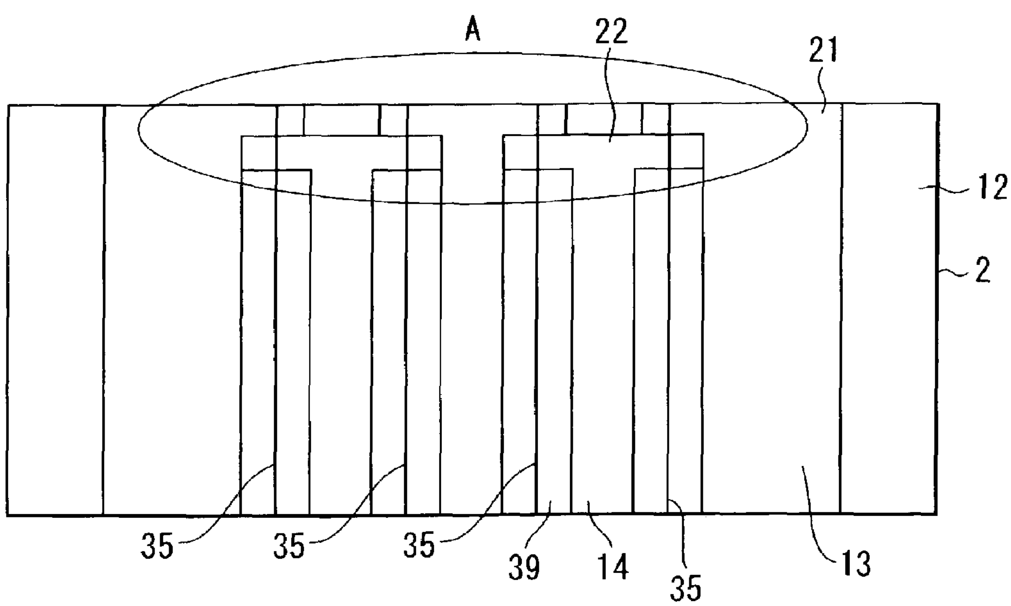
FIG. 10 is a plan view illustrating diffusion areas in the semiconductor substrate in FIGS. 8 and 9.

FIG. 10 is a plan view illustrating the diffusion areas in the semiconductor substrate shown in FIGS. 8 and 9. In the impurity diffusion areas formed as shown in FIGS. 8 and 9, the P and N type impurities cancel each other in areas 39. As a result, N type areas 21 and P type areas 22 are alternately arranged. The PN junctions 35 are formed perpendicularly in a depth direction of the substrate. Those portions of the P type areas 22 which are located in an area "A" lying at the top of the semiconductor substrate 2 shown in FIG. 10 are shown offset from the substrate surface for the convenience of description but actually rest on it. The first diffusion areas with a high phosphorous concentration exhibit the same polarity as that of the N type. The second diffusion areas 14 with a high phosphorous concentration exhibit the same polarity as that of the P type.

Figure 11:
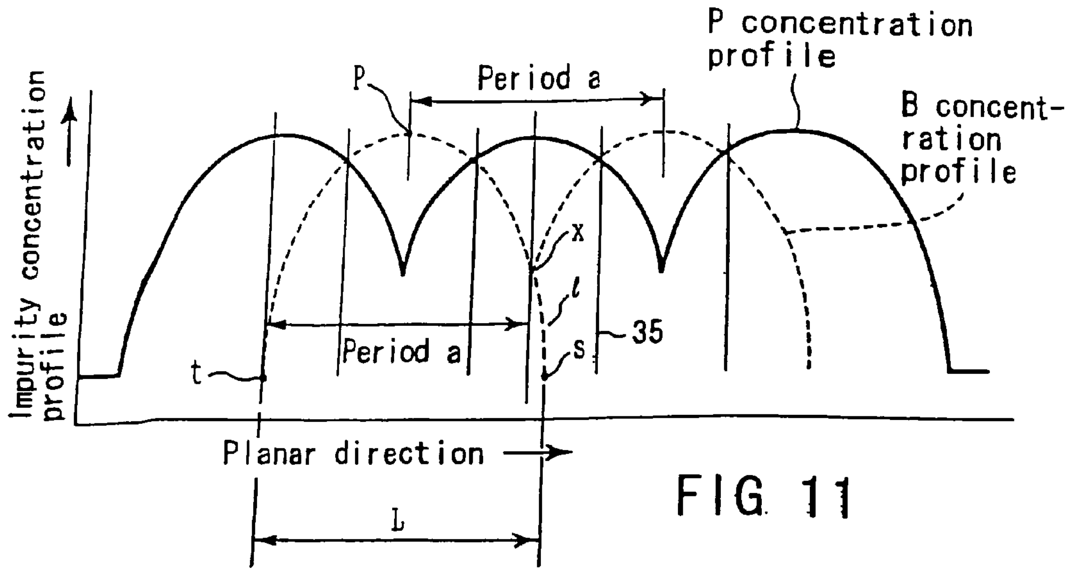
FIG. 11 is a graph showing an impurity concentration profile of the semiconductor device in FIGS. 8 and 9.
Figure 12:
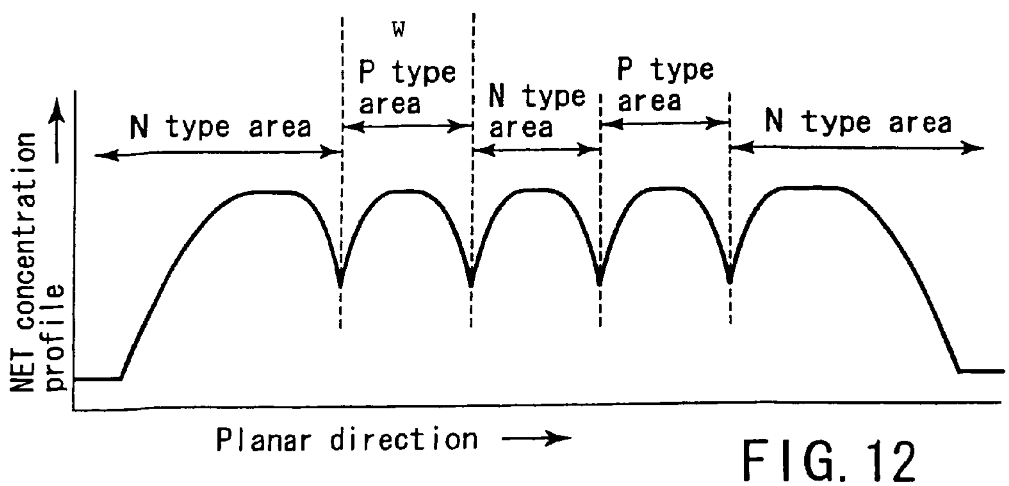
FIG. 12 is a graph showing an NET concentration profile of the semiconductor device in FIGS. 8 and 9.

FIGS. 11 and 12 are characteristic diagrams showing an impurity and NET concentration profiles of the impurities injected into the semiconductor substrate shown in FIGS. 8 and 9, in a portion of the semiconductor substrate taken along line X—X in these figures. The boron and phosphorous (hereinafter collectively referred to as "impurities") injected into the semiconductor substrate 10 are diffused and exhibit an impurity and NET concentration profiles such as those shown in FIGS. 11 and 12. As shown in FIGS. 11 and 12, P type areas (having the same polarity as that of the P type) and N type areas (having the same polarity as that of the N type) are alternately formed. The adjacent individual boron diffusion areas 33 are joined together and the concentration distribution (B concentration profile) of the boron diffusion areas 33 in the planar direction of the semiconductor substrate 10 (hereinafter referred to as the "substrate planar direction") has a period "a".

The period "a" substantially corresponds to the period of concentration of the impurities in the first or second diffusion area 13 or 14, or the pitch of the diffusion areas 13 or 14, or the spacing between the phosphorous or boron injection areas 32 or 31. These descriptions also apply to the P concentration profile. The junctions 35 are each formed at the position where the phosphorous (P) concentration profile equals the boron (B) concentration profile.

The boron injection areas 31 and the phosphorous injection areas 32 are formed, for example, under the above described conditions. As a result, the period "a" of the boron diffusion areas 33 and phosphorous diffusion areas 34 is smaller than the maximum diffusion length (diffusion width) of the individual diffusion areas 33 and 34 in the substrate planar direction. Thus, a high impurity concentration area extends widely in the first and second diffusion areas 13 and 14.

In FIG 11, the extension 1 completes the representation of the profile of the boron diffusion area with the peak concentration in P. The point s is determined symmetrically to the minimum concentration point t with respect to the peak concentration point P. The distance between the points t and s is the maximum diffusion width L. The period a of the boron concentration profile is smaller than maximum diffusion width L ($a<L$). The width W of one p type area of FIG 12 (corresponding to the distance between junctions 35 in FIG 11) is half the period a ($2W=a$). The width W of the p type area is smaller than half the maximum diffusion width ($W<L/2$).

Figure 37:
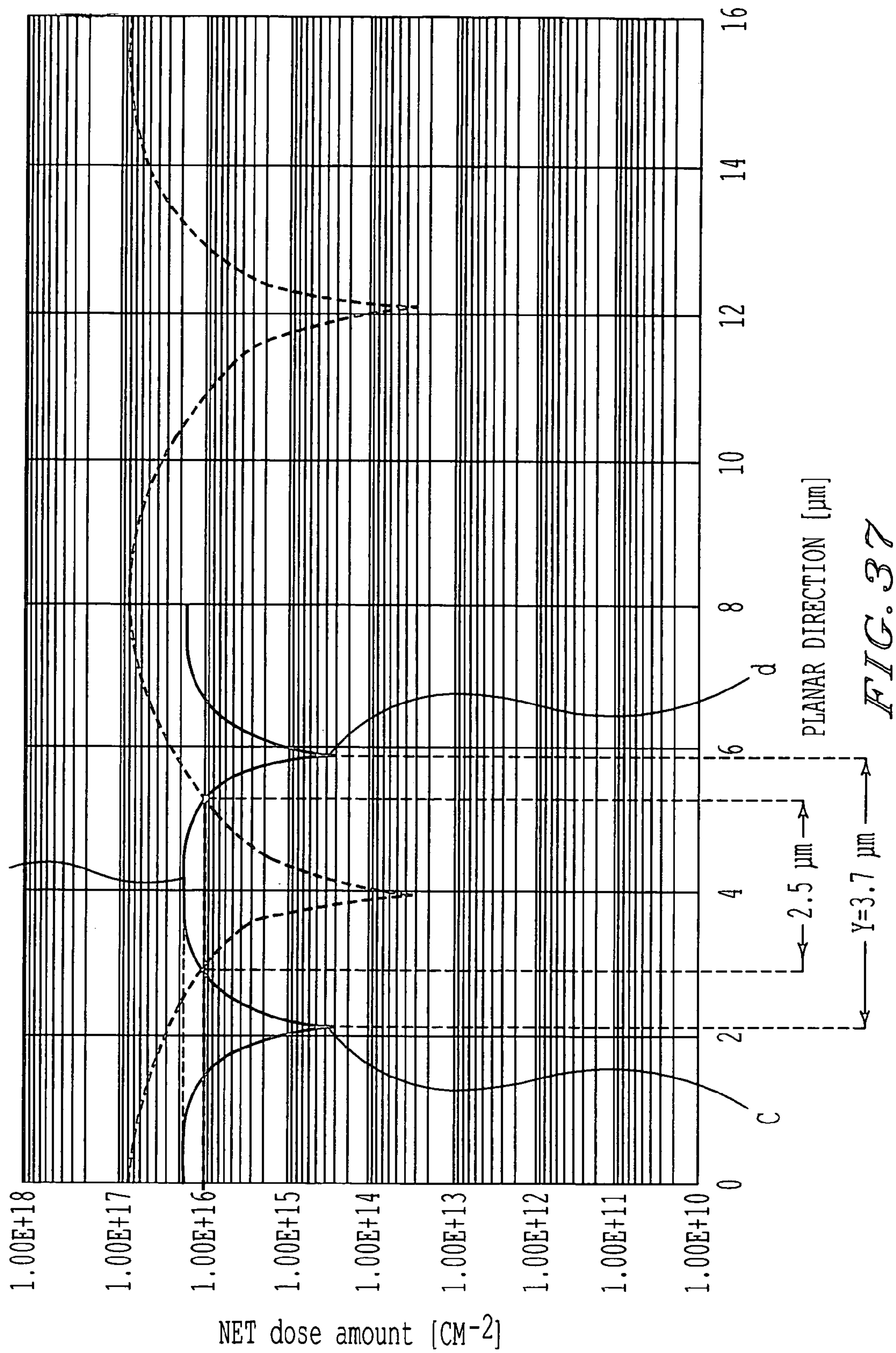
FIG. 37 is a graph showing a NET dose amount of the semiconductor device in FIG. 10.

By way of example, in FIG 37, the distance $Y=3.7\ \mu m$, between two adjacent relative minimum concentration points c and d, corresponds to the diffusion width of the first diffusion layer 13 or second diffusion layer 14. The peak concentration point Q is $1.8\times10^{16}\ cm^{-2}$. The distance between points corresponding to 50% of the peak concentration ($0.9\times10^{16}\ cm^{-2}$) is $2.5\ \mu m$.

The high impurity concentration area extending widely will now be explained with examples. FIG. 37 shows a NET dose amount along the line XI—XI in FIG. 10 and a comparison between the embodiment and a prior art. Only either of P profile and N profile is shown in the figure. Also, the solid line exhibits the embodiment and the broken line shows the prior art. A concrete condition for the figure is that the period "a" is 8 $\mu m$ in the embodiment and 16 $\mu m$ in the prior art. Other conditions remain the same in both cases.

As shown in FIG. 37, an area (70% area or more) in which a concentration is 70% of the peak concentration extends over 50% of the first and second diffusion areas 13 and 14 in the embodiment while 25% in the prior art. In the case of an area (50% area or more) in which the concentration is 50% of the peak concentration extends over 65% of the first and second diffusion areas 13 and 14 in the embodiment, while 40% in the prior art. That is, an area in which a concentration is over 50% of the peak concentration extends over 50% to 65% of the first and second diffusion areas 13 and 14 in the embodiment.

According to the first embodiment, the first and second diffusion areas 13 and 14 are formed in the second semiconductor substrate 2 with a low impurity concentration, using impurities formed by ion injection and diffusion. The first and second diffusion areas 13 and 14 are defined by the concentrations and overlapping portions in the second substrate 2. Thus, the first and second diffusion areas 13 and 14 can be formed to be narrower while avoiding joining the adjacent second diffusion areas 14 together. This serves to provide a semiconductor device with reduced on resistance.

According to the first embodiment, the period a of impurity concentration of each of the first and second diffusion areas 13 and 14 is smaller than the maximum diffusion length of the boron diffusion areas 33 and phosphorous diffusion areas 34 in the substrate planar direction. Thus, junction 35 is formed at the vicinity of the center of the boron diffusion areas 33 and phosphorous diffusion areas 34. As a result, most part of the first and second diffusion layers 13 and 14 are formed at the vicinity of the center of the phosphorous diffusion areas 34 and the boron diffusion areas 33, and this part has a high impurity concentration. Thus, the impurity concentration of the first diffusion areas 13, which constitute a current passage, is high while the MISFET is on. This serves to provide a semiconductor device with reduced on resistance. Further, narrow width (small period "a") of the first and second diffusion layers 13 and 14 help these diffusion layers 13 and 14 deplete completely. This serves to provide a semiconductor device with a high withstand voltage, while reducing a cell pitch.

Further, the balance of total sum of impurity concentrations in the first and second diffusion areas 13 and 14 is important to obtain a high withstand voltage. According to the present application, adding an N type dopant during epitaxial growth conventionally forms N type impurities corresponding to the first diffusion areas 13. On the other hand, an ion injection forms the first and second diffusion areas 13 and 14 in the first embodiment. The ion injection improves concentration controllability, thus allowing the balance to be maintained easily even with finer design.

(Second Embodiment)

A second embodiment will be described with reference to FIGS. 13 to 20. In the first embodiment, the second semiconductor substrate 2 is composed of, for example, a single epitaxial growth layer or the like. In contrast, a semiconductor device according to the second embodiment has a structure in which the second semiconductor substrate 2 has a plurality of layers and in which PN junctions are formed to be deeper by repeating the manufacturing method of the first embodiment.

Figure 13:
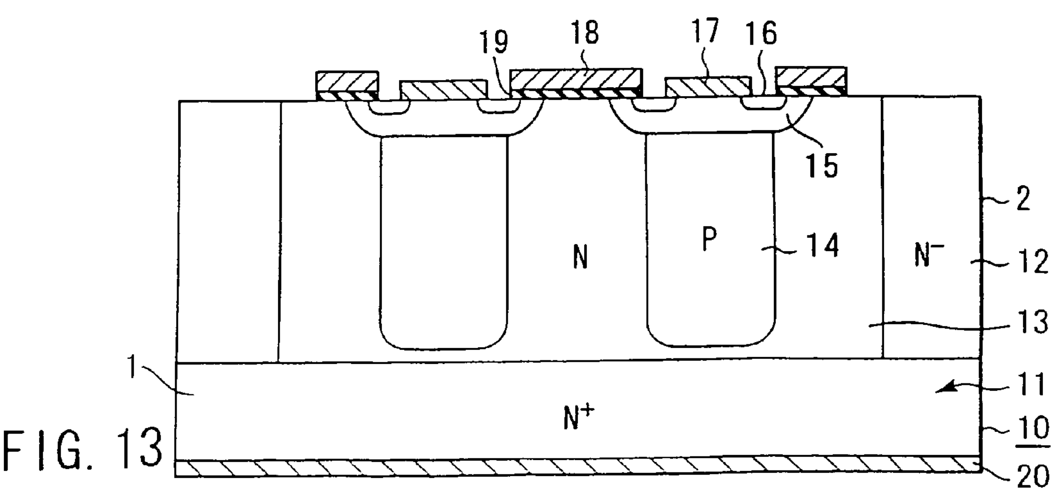
FIG. 13 is a diagram showing the sectional structure of a semiconductor device according to a second embodiment of the present invention.

FIG. 13 shows the sectional structure of the semiconductor device according to the second embodiment of the present invention. This semiconductor device is a vertical MISFET in which PN junctions are formed to extend in the depth direction. In the second embodiment, the second semiconductor substrate 2 is composed of a plurality of epitaxial growth layers consisting of, for example, silicon. The first and second diffusion areas 13 and 14 are formed by forming a plurality of different impurity diffusion areas in the respective layers and joining the impurity diffusion areas with the same polarity together lengthwise. As a result, the PN junctions are formed to be deeper than those in the first embodiment as shown in FIG. 13.

Figure 14:
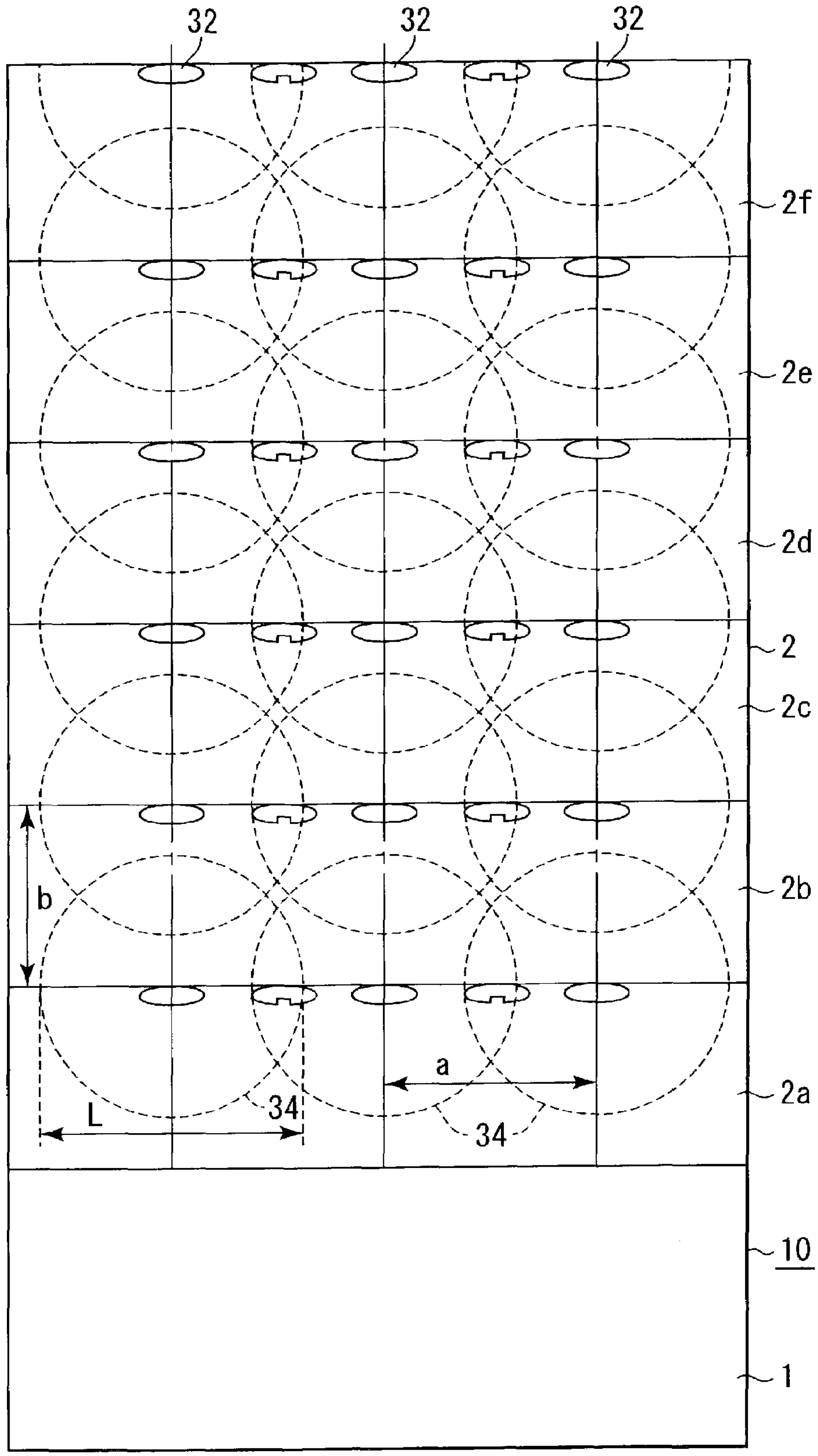
FIGS. 14 to 16 are diagrams illustrating first and second diffusion layers 13 and 14, shown in FIG. 13, and a method of manufacturing the same.
Figure 15:
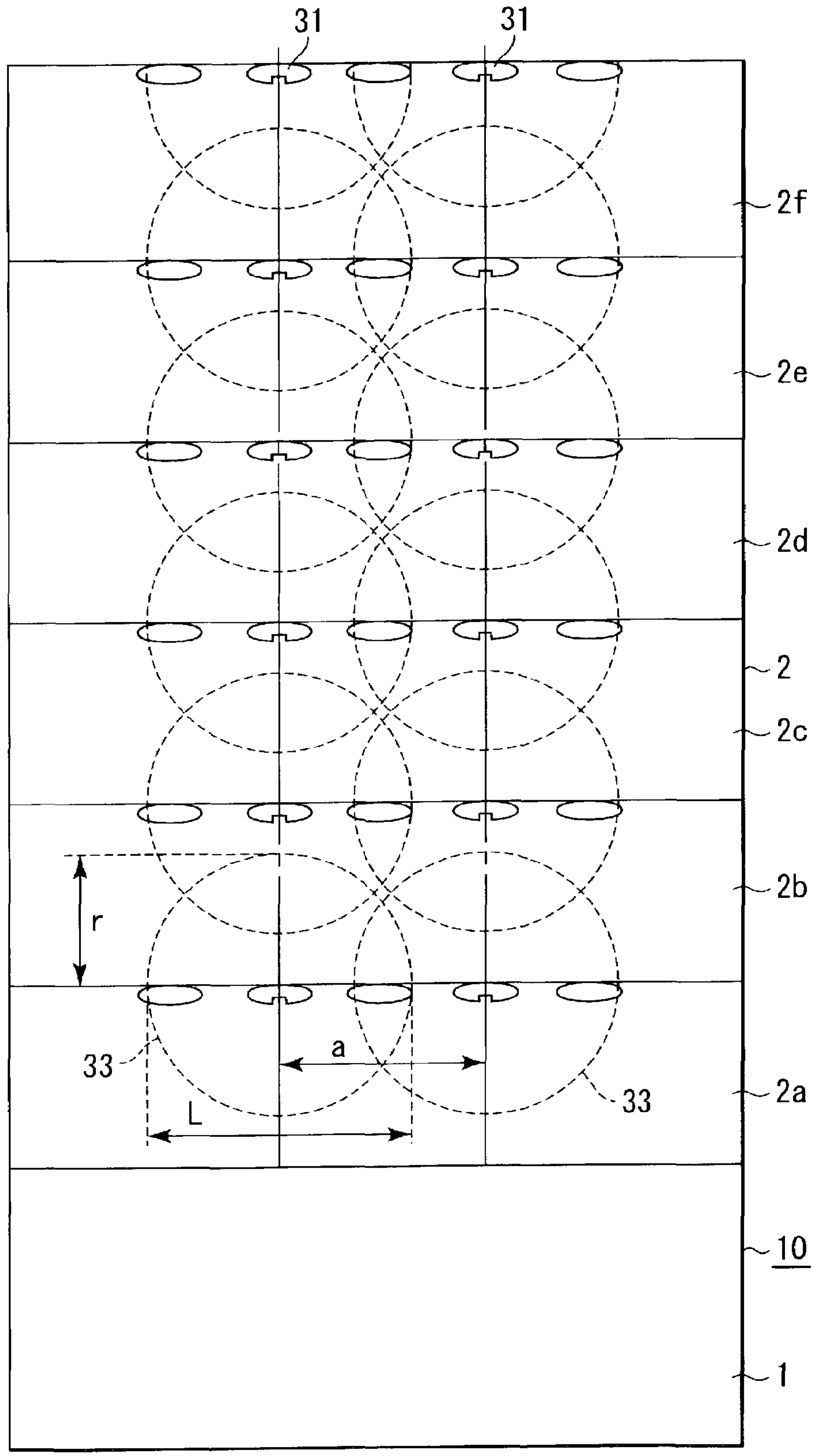
Figure 16:
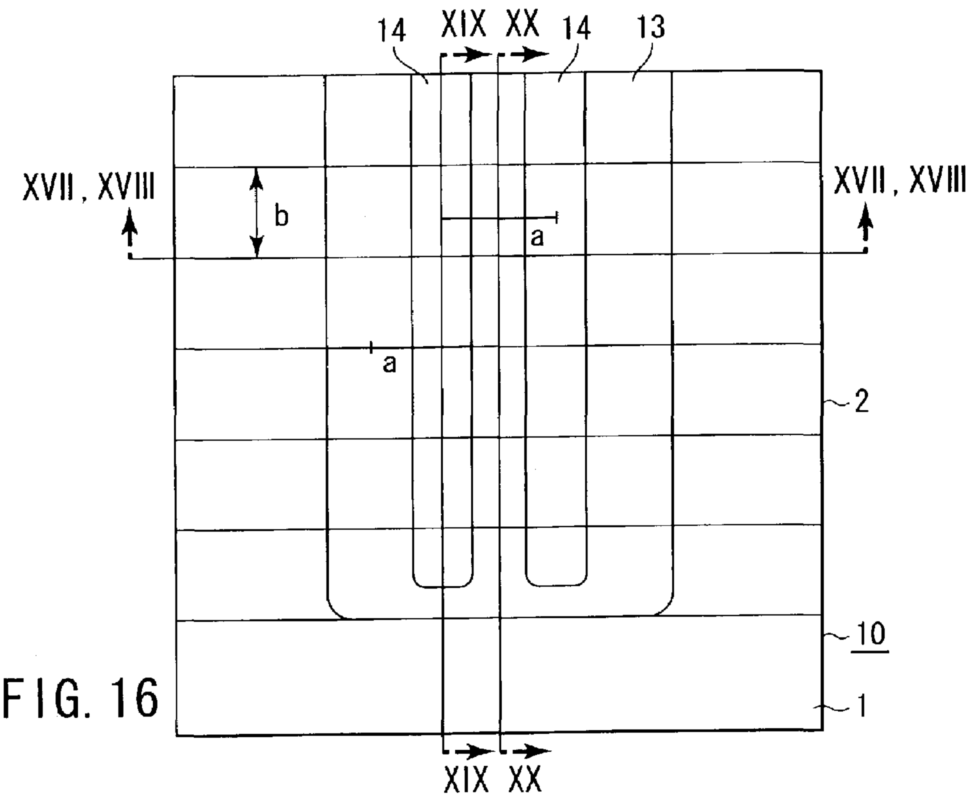

Now, with reference to FIGS. 14 and 15, detailed description will be given of the second semiconductor substrate 2 and the first and second diffusion areas 13 and 14. FIGS. 14 and 15 are sectional views illustrating the first and second diffusion areas 13 and 14. Description will also be given of a method of forming these portions. In FIGS. 14 and 15, the second semiconductor substrate 2 is formed by repeating a single epitaxial layer configured as described in Embodiment 1, for example, six times.

As shown in FIGS. 14 and 15, the second semiconductor substrate 2 is composed of a plurality of epitaxial layers (2*a* to 2*f*). These epitaxial layers 2*a* to 2*f* are formed as described below. First, the boron injection areas 31 and the phosphorous injection areas 32 are formed in the surface area of the first epitaxial layer 2*a* as described in the first embodiment. Then, the second epitaxial layer 2*b* is formed on the first epitaxial layer 2*a*. Then, the boron injection areas 31 and the phosphorous injection areas 32 are formed in the surface area of the second epitaxial layer 2*b* so as to join with the injection areas 31 and 32, respectively, in the first layer 2*a* lengthwise of the substrate. Subsequently, the above steps are repeated until the sixth layer 2*f* is formed. Then, the phosphorous diffusion areas 34 and the boron diffusion areas 33 are formed from the phosphorous and boron injection areas, respectively, in each layer by thermal treatment.

The thermal treatment makes the first and second diffusion layers 13 and 14 from the phosphorous diffusion areas 34 and the boron diffusion areas 33. PN junctions are formed in the semiconductor substrate 10 in the vertical direction.

Further, in FIGS. 14 and 15, the thickness of a single epitaxial growth layer constituting the second semiconductor substrate 2 (the period of the concentration of impurities in the substrate depth direction) is defined as "b". Further, the diffusion length of P type impurities (boron) or N type impurities (phosphorous) in the depth direction is defined as "r", and then the diffusion length (spread width) of P type impurities or N type impurities in the substrate planar direction is defined as "L". In this case, relationships shown below are established between the periods "a" and "b" of the boron diffusion area 33 or phosphorous diffusion area 34, between "a" and "L", and between "b" and "r", respectively.

$$L>a \quad (1)$$

$$r>b/2 \quad (2)$$

In other words, as L>a, the P type and N type diffusion areas in the planar direction, shown in FIG. 12 have widths with are smaller than half the maximum diffusion width L shown in FIG. 14.

Figure 17:
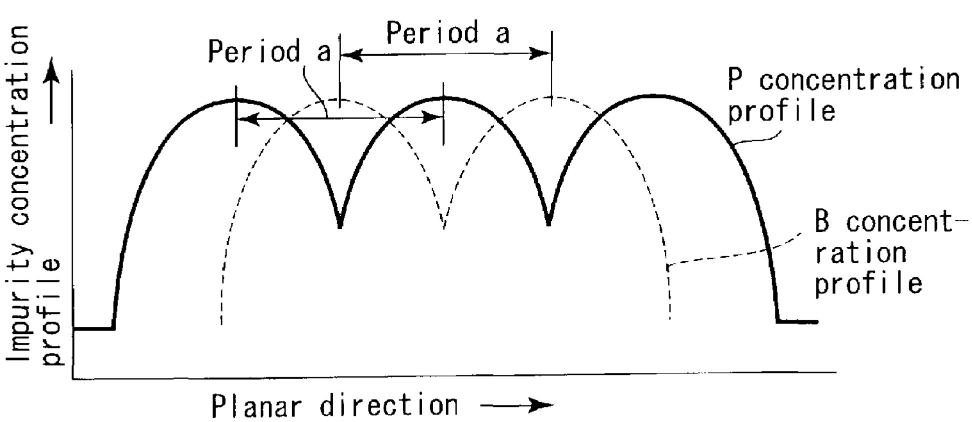
FIG. 17 is a graph showing an impurity concentration profile of the semiconductor device in FIG. 16.
Figure 18:
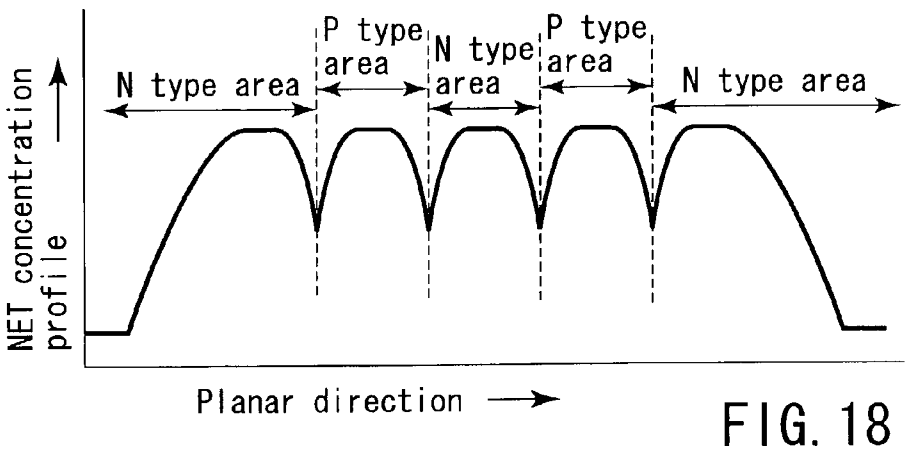
FIG. 18 is a graph showing an NET concentration profile of the semiconductor device in FIG. 16.

Now, the diffusion structure of the second semiconductor substrate 2 will be described with reference to FIGS. 17 to 20. FIG. 17 is a characteristic diagram showing an impurity concentration profile of that portion of the second semiconductor substrate 2 shown in FIG. 16 takes along the line XVII—XVII. The first and second diffusion areas 13 and 14 are formed at a pitch (period) "a". FIG. 18 is a characteristic diagram in which the impurity concentration profile shown in FIG. 17 is replaced with a NET concentration profile.

Figure 19:
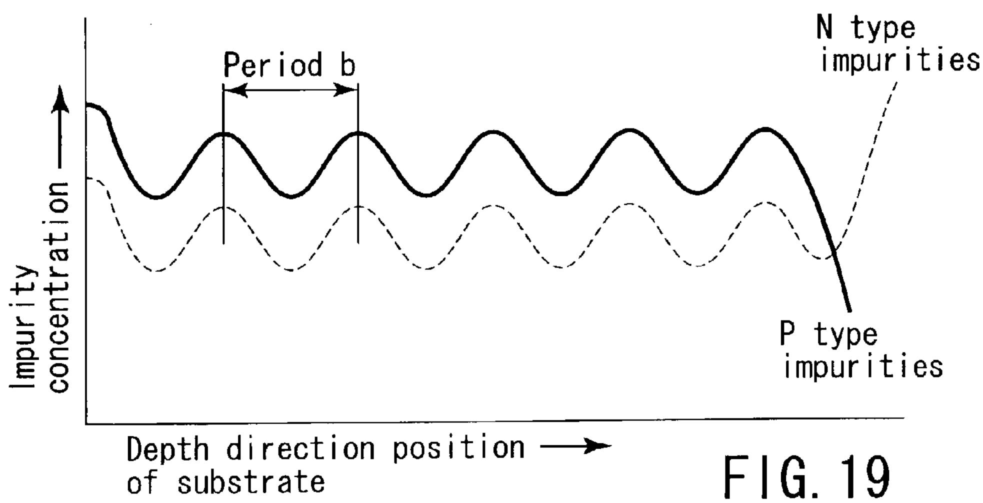
FIGS. 19 and 20 are graphs showing the concentration of impurities in a depth direction of a second semiconductor substrate 2.

FIG. 19 is a characteristic diagram showing the impurity concentration of a portion of the second semiconductor substrate 2 taken along the line XIX—XIX. The P type impurity concentration is higher than the N type impurity concentration in this area, and the area exhibits the second diffusion area 14 which has the same polarity as that of the P type.

Figure 20:
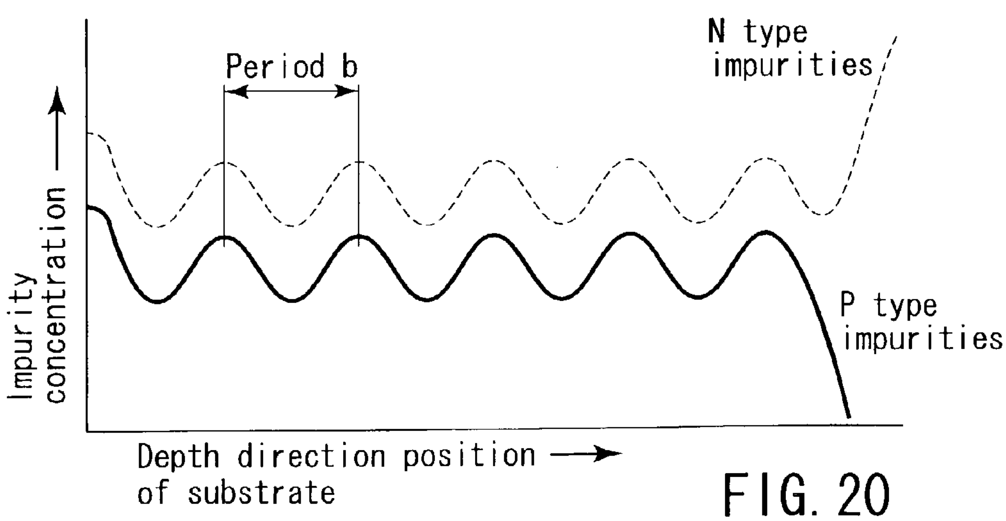

FIG. 20 is a characteristic diagram showing the impurity concentration of a portion of the second semiconductor substrate 2 taken along the line XX—XX.

The N type impurity concentration is higher than the P type impurity concentration in this area, and the area exhibits the first diffusion area 13 which has the same polarity as that of the N type. As shown in FIGS. 19 and 20, the concentrations of the N and P type impurities vary with the period "b".

Figure 21:
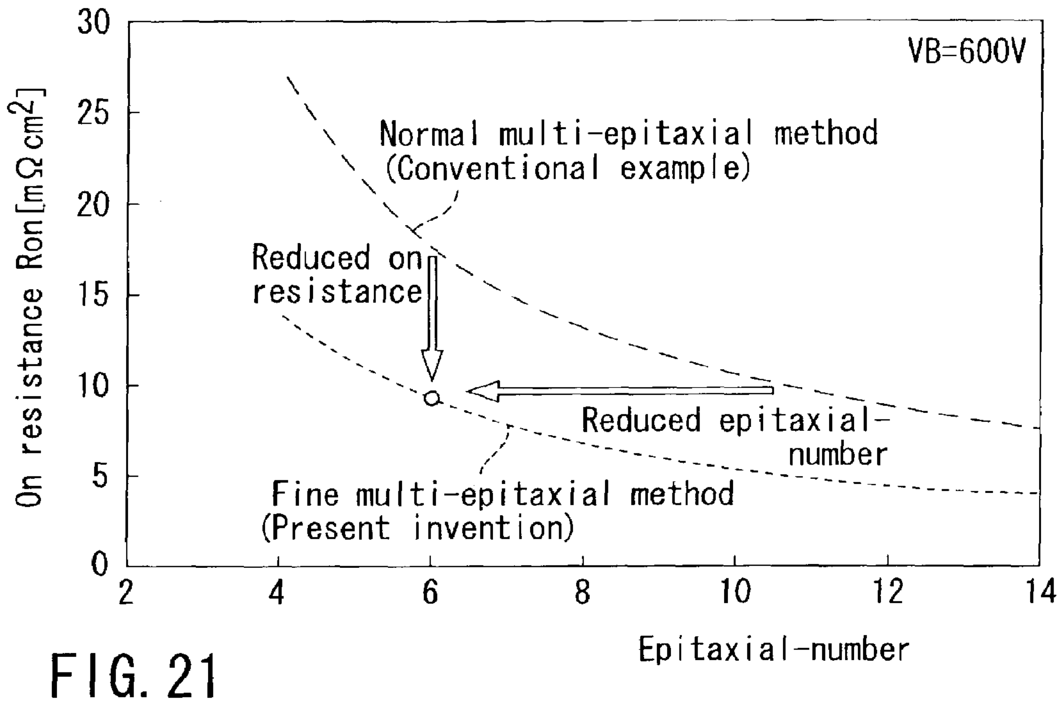
FIG. 21 is a diagram showing the relationship between the epi-number and on resistance of the semiconductor substrate.
Figure 34:
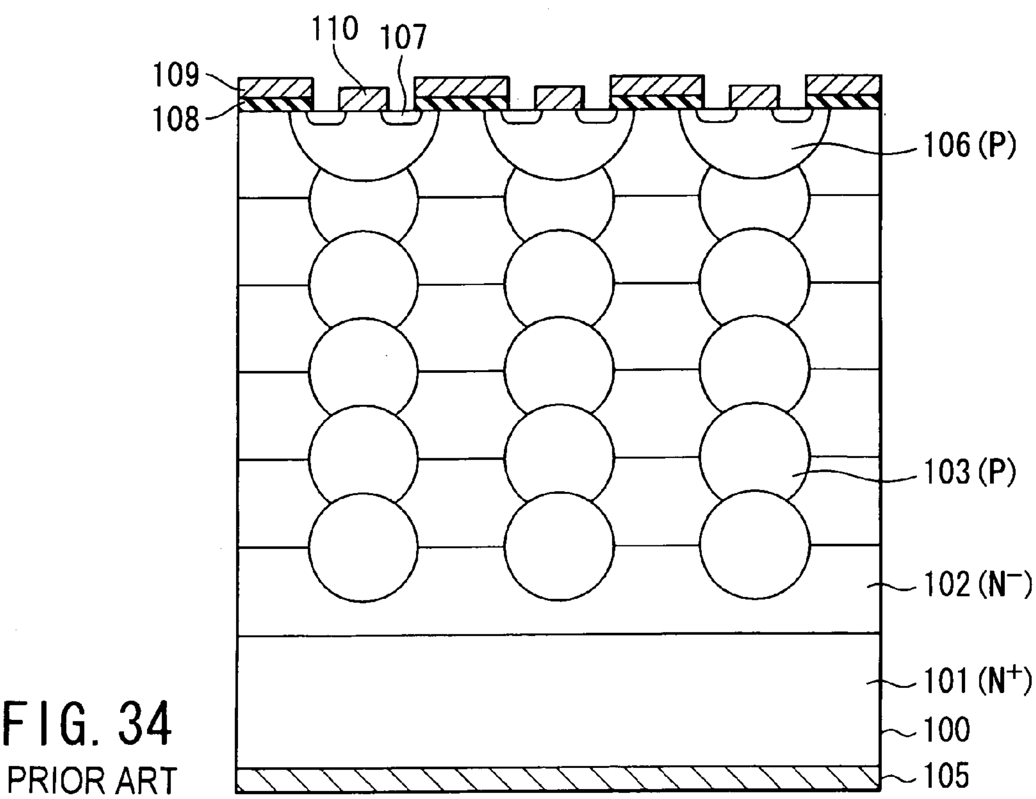
FIGS. 34 to 36 are sectional views of a conventional vertical MISFET.
Figure 35:
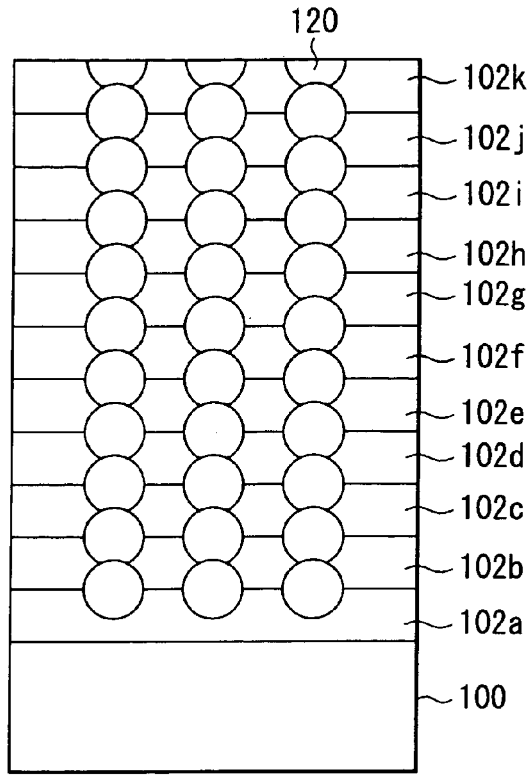
Figure 36:
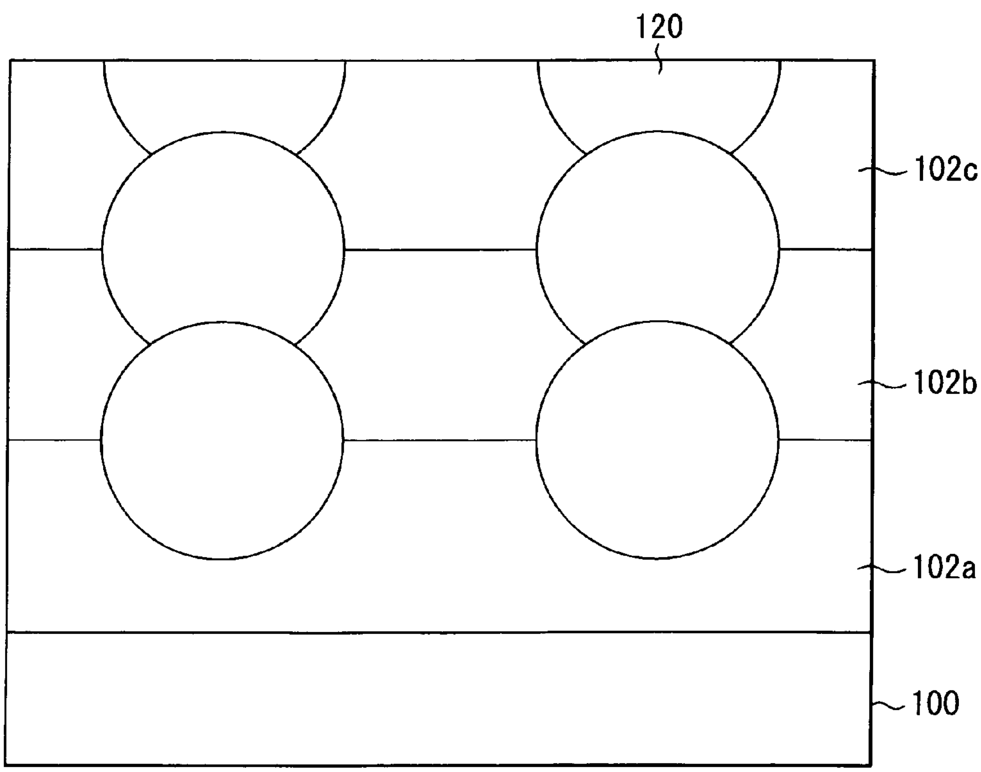

Now, description will be given below of a comparison of the second embodiment with a conventional example. FIG. 21 is a characteristic diagram showing the relationship between the number of epitaxial growths carried out to form the epitaxial growth layers (hereinafter referred to as the "epitaxial number") and on resistance of the semiconductor substrate. The epitaxial number affects on resistance of the element, as shown in FIG. 21. The axis of abscissas in FIG. 21 indicates the epitaxial number, while the axis of ordinates indicates the on resistance Ron ($m\Omega cm^2$) Ron denotes the on resistance normalized by the area of the FET. The characteristic curve in FIG. 21 shows the dependence of the on resistance on the epitaxial number in a method described in the second embodiment (a fine multi-epitaxial method) and in a method (normal multi-epitaxial method) according to the conventional example shown in FIGS. 34 to 36.

As described in the first embodiment, narrowing the first and second diffusion layers 13 and 14 can increase the impurity concentrations of these diffusion layers 13 and 14, and thus the on resistance can be reduced. This is shown in FIG. 21. As shown in this figure, with the same epitaxial number, the method according to the present embodiment allows the first and second diffusion layers 13 and 14 to be narrowed. Accordingly, the on resistance thus obtained is half of that obtained in the conventional example. The figure also indicates that the same on resistance can be accomplished using half the epitaxial number compared to the conventional example.

According to the second embodiment, the second semiconductor substrate 2 is configured similarly to the first embodiment. Thus, the second embodiment produces effects similar to those of the first embodiment.

Further, the second embodiment 2 has a structure in which a plurality of epitaxial layers are stacked together a number of times. Furthermore, the concentration period "a" of each first diffusion area 13 or second diffusion area 14 in the substrate planar direction is greater than the concentration period "b" (the thickness of a single epitaxial layer) in the substrate depth direction (a>b). This also serves to increase the impurity concentrations of the first and second diffusion areas 13 and 14 and provide a semiconductor device with a high withstand voltage and reduced on resistance, as in the first embodiment. It is noted that the advantages brought about by the second embodiment can be obtained while the relationship between "a" and "b" is a<b. However, design and implementation can be performed easily when the relationship is a>b than a<b.

Further, the second semiconductor substrate 2 having such characteristics has a structure in which a plurality of epitaxial layers are stacked together a number of times.

Thus, if a semiconductor device is formed with the same epitaxial number as that in the conventional example, about half the on resistance is obtained compared to the conventional example. On the other hand, the same on resistance can be accomplished using half the epitaxial number compared to the conventional example.

(Third Embodiment)

A third embodiment will be described with reference to FIGS. 22 to 24. In addition the structure of the second embodiment, the third embodiment has a structure in which diffusion areas are further repeatedly formed breadthwise.

Figure 22:
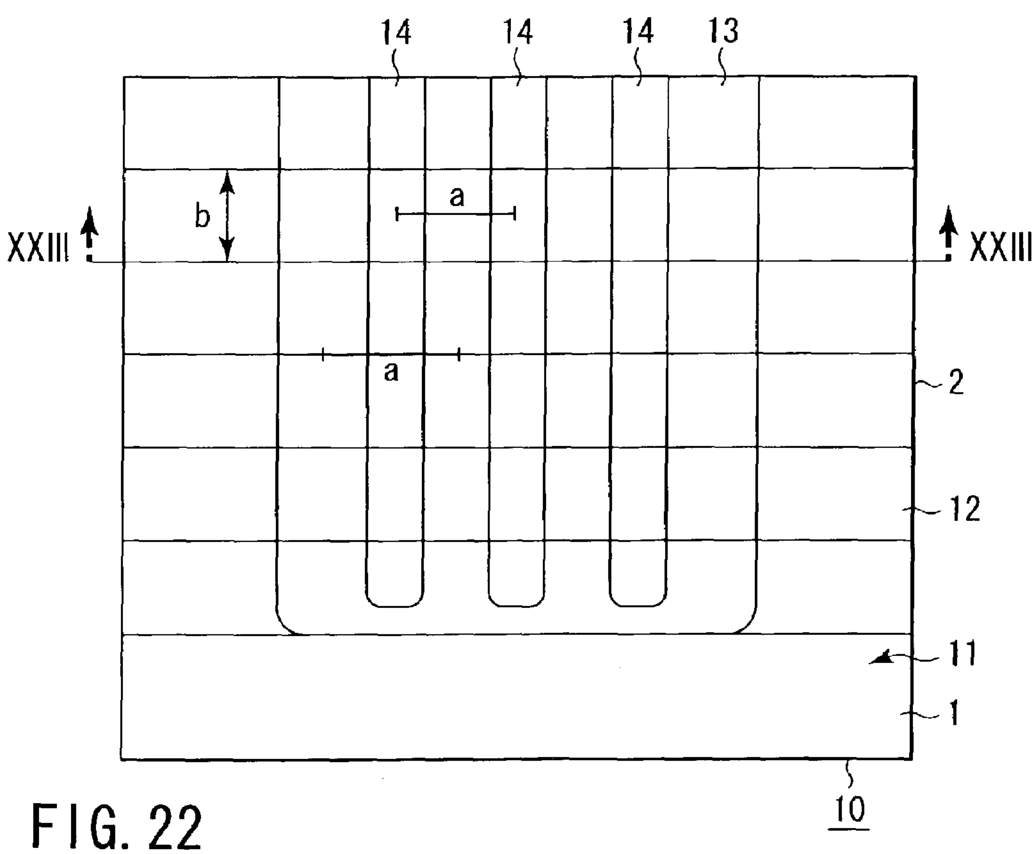
FIG. 22 is a diagram showing the sectional structure of a semiconductor device according to a third embodiment of the present invention.

FIG. 22 shows the sectional structure of a semiconductor device according to the third embodiment of the present invention, i.e. the sectional structure of a semiconductor substrate provided with vertical MISFET elements. As shown in FIG. 22, for example, three second diffusion areas (P type areas) 14 are formed inside the semiconductor substrate 2 so as to be each sandwiched between the first diffusion areas (N type areas) 13. It is possible to further increase the number of second diffusion areas 14.

Figure 23:
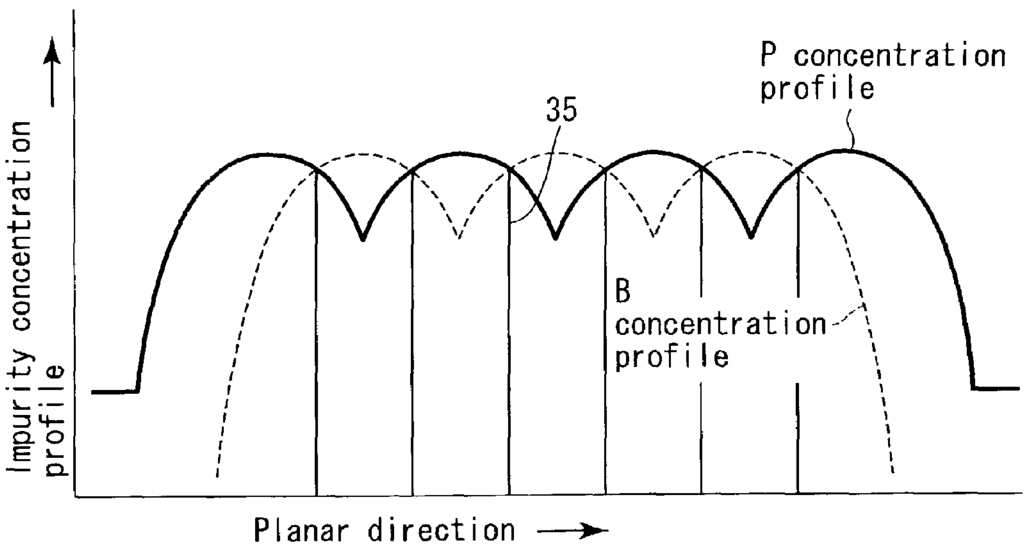
FIG. 23 is a graph showing an impurity concentration profile of the semiconductor device in FIG. 22.
Figure 24:
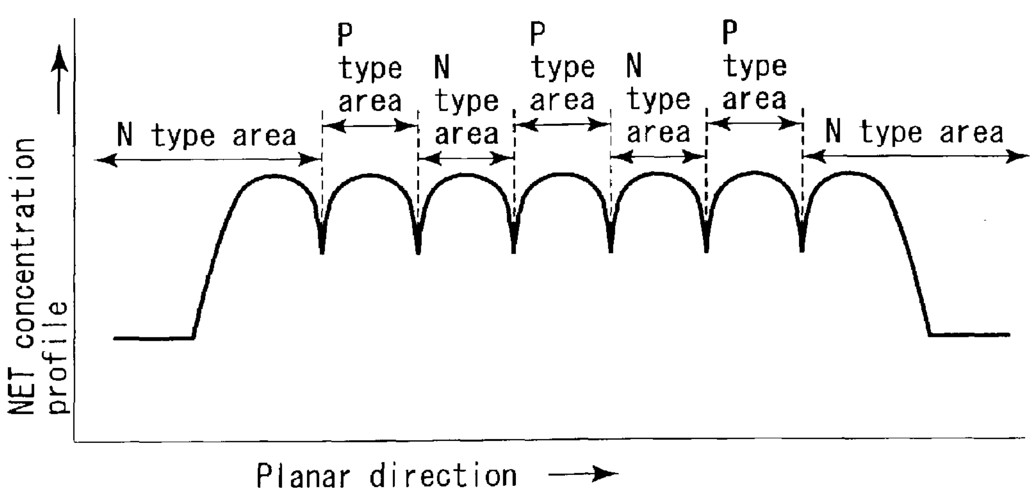
FIG. 24 is a graph showing an NET concentration profile of the semiconductor device in FIG. 22.

FIG. 23 shows an impurity concentration profile of a portion of the semiconductor device taken along the line XXIII—XXIII in FIG. 22. FIG. 24 shows a NET concentration profile indicating the total concentration distribution of the same portion.

According to the third embodiment, the second embodiment 2 and the first and second diffusion areas 13 and 14 are structured similarly to the second embodiment. Thus, the third embodiment produces effects similar to those of the first and second embodiments.

Furthermore, according to the third embodiment, three or more second diffusion areas 14 are formed. Thus, the MISFET elements can be formed with a high density. This provides a semiconductor device that can be highly integrated.

(Fourth Embodiment)

A fourth embodiment relates to a structure used in addition to those of the first to third embodiments, and is directed to a terminal structure of a semiconductor device. As described above, according to the first to third embodiments of the present invention, the concentration of the second semiconductor substrate 2 can be maintained at a low level. This is because, injecting ions into an N type semiconductor substrate with a low concentration makes N and P type pillar-like diffusion layers as opposed to injecting P type impurities into an N type semiconductor substrate with a high concentration in the conventional example.

Figure 25:
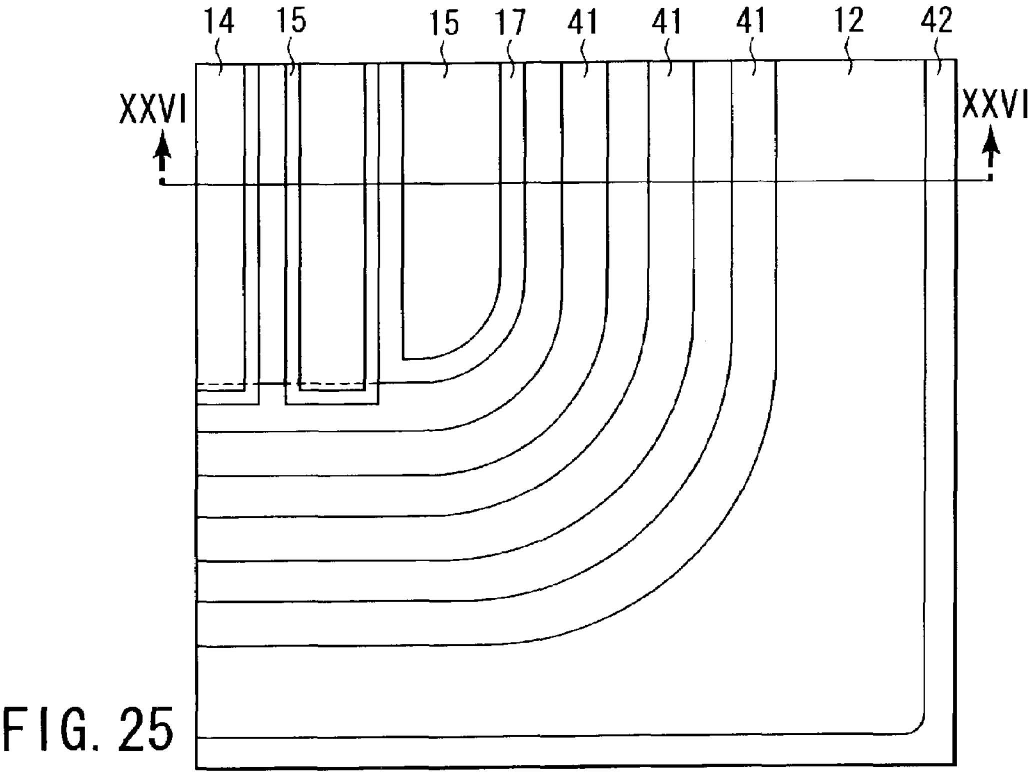
FIG. 25 is a diagram showing the planar structure of a semiconductor device according to a fourth embodiment of the present invention.
Figure 26:
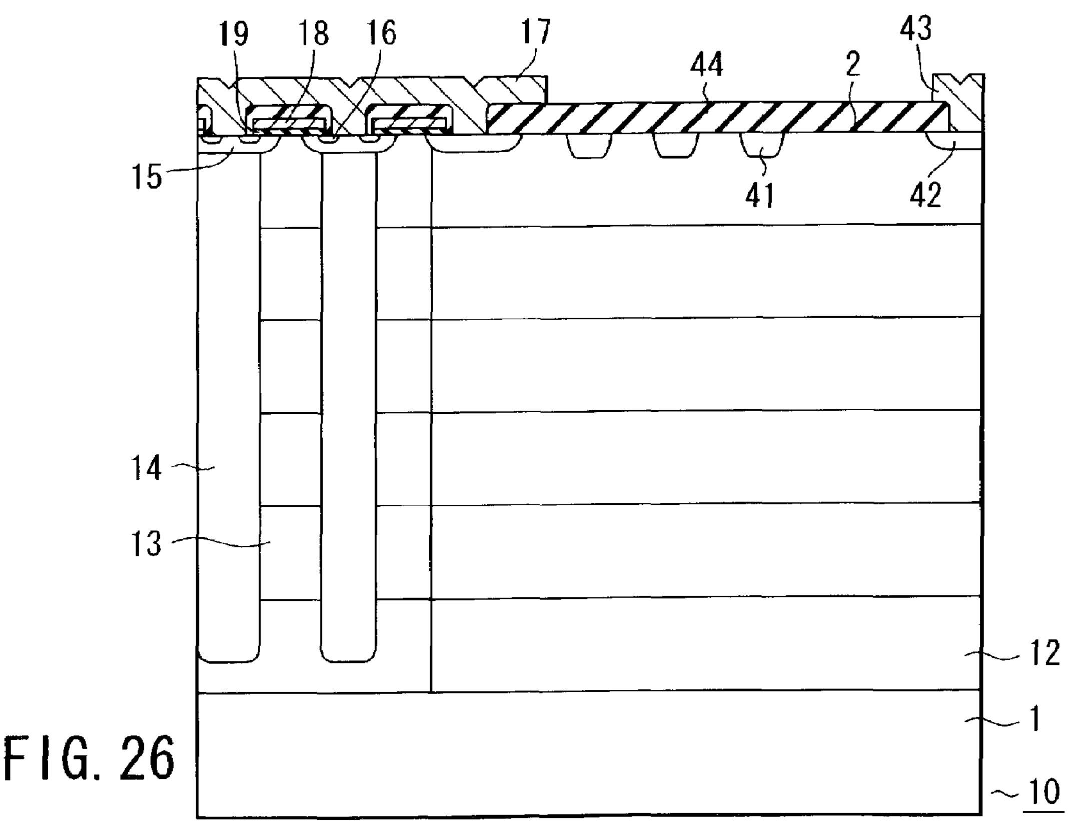
FIG. 26 is a diagram showing the sectional structure of the semiconductor device in FIG. 25.

FIG. 25 shows the planar structure of a semiconductor device according to the fourth embodiment of the present invention. FIG. 26 shows the sectional structure of a portion of the semiconductor device taken along the line XXVI—XXVI in FIG. 25. In FIGS. 25 and 26, a portion of the semiconductor device provided with a MISFET has a structure similar to that in the second or third embodiment. In addition, in FIG. 26, the first impurity diffusion layers 13, the N source areas 16, the gate electrodes 18, and insulating films 44 and $N^+$ stopper electrodes 43, described later, are omitted.

As shown in FIGS. 25 and 26, the first and second diffusion layers 13 and 14 are not formed near a terminal of the semiconductor device. That is, the first and second diffusion layers 13 and 14 are spaced from the terminal of the semiconductor device. For example, three guard rings 41 of an appropriate width are formed around a MISFET element at predetermined intervals. The guard rings 41 are each formed on the surface of the second semiconductor substrate 2 in the area (hereinafter referred to as the "terminal area of the semiconductor device") between the terminal of the MISFET element, i.e. the corresponding end of the first diffusion layer 13 and the corresponding end of the semiconductor device. Further, the guard rings 41 are formed of an impurity diffusion area of the second conductive type.

An $N^+$ stopper layer 42 with a high concentration is formed at the end of the semiconductor device and on the surface of the second semiconductor substrate 2. An $N^+$ stopper electrode 43 is formed on the $N^+$ stopper layer 42. An insulating film (interlayer film) 44 is formed in the terminal area of the semiconductor device and on the surface of the second semiconductor substrate 2.

The effects of the fourth embodiment will be described below. In the terminal area of the semiconductor device, a depletion layer must be formed to an appropriate extent in order to obtain a withstand voltage in this area. However, if a semiconductor layer (corresponding to the second semiconductor substrate 2 in the present embodiments) provided with N and P type diffusion layers has a high concentration as in the prior art, a depletion layer extending to the terminal is not sufficiently formed. Accordingly, separate measures are required in order to sufficiently extend the depletion layer. However, according to the first to third embodiments of the present application, the impurity concentration of the second semiconductor substrate 2 can be reduced. Consequently, it is possible to form a depletion layer extending to the terminal of the semiconductor without any special measures. Thus, when, in addition to such a structure, the guard rings 41 are formed as in the fourth embodiment, a depletion layer can be formed to a larger extent.

According to the fourth embodiment, the second semiconductor substrate 2 and the first and second diffusion layers 13 and 14 are structured similarly to the first to third embodiments. The fourth embodiment thus produces effects similar to those of the first to third embodiments.

Furthermore, according to the fourth embodiment, the terminal area not provided with the first or second diffusion layers 13 or 14 is formed, and the second semiconductor substrate 2, provided with the first and second diffusion layers 13 and 14, have a low impurity concentration. Thus, a depletion layer extending to the terminal of the semiconductor device is formed in this area. This serves to provide a semiconductor device with a high withstand voltage. Furthermore, the formation of the guard rings 41 allows a depletion layer to be formed to a larger extent.

(Fifth Embodiment)

A fifth embodiment relates to a variation of the fourth embodiment.

Figure 27:
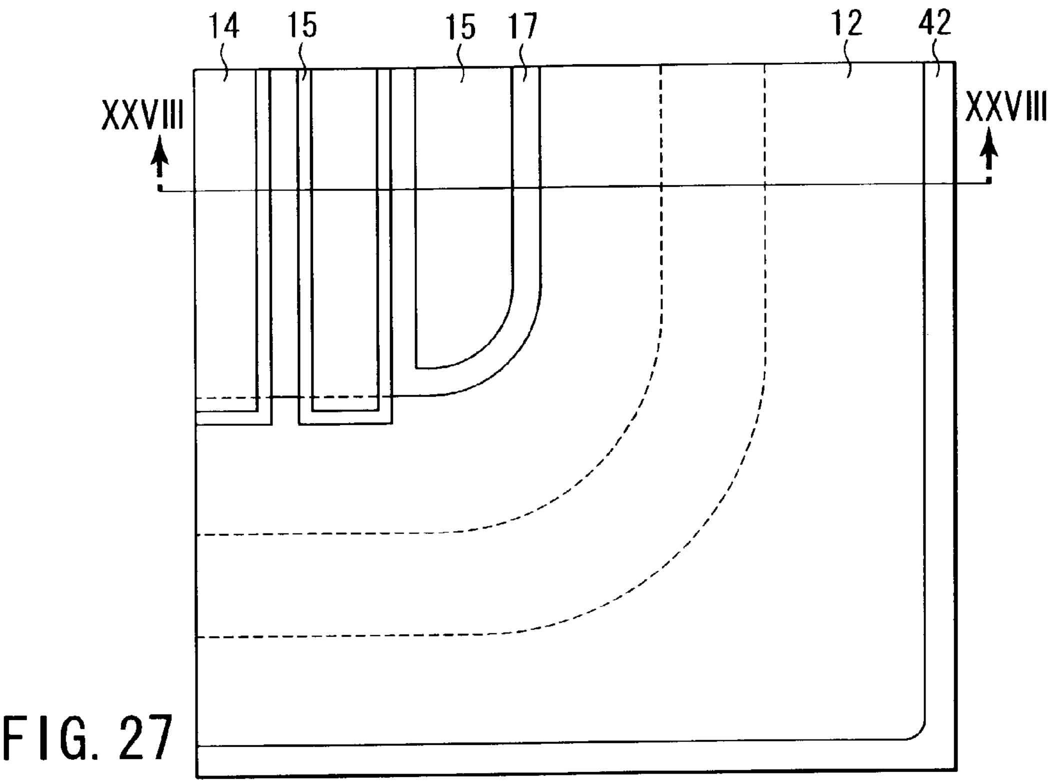
FIG. 27 is a diagram showing the planar structure of a semiconductor device according to a fifth embodiment of the present invention.
Figure 28:
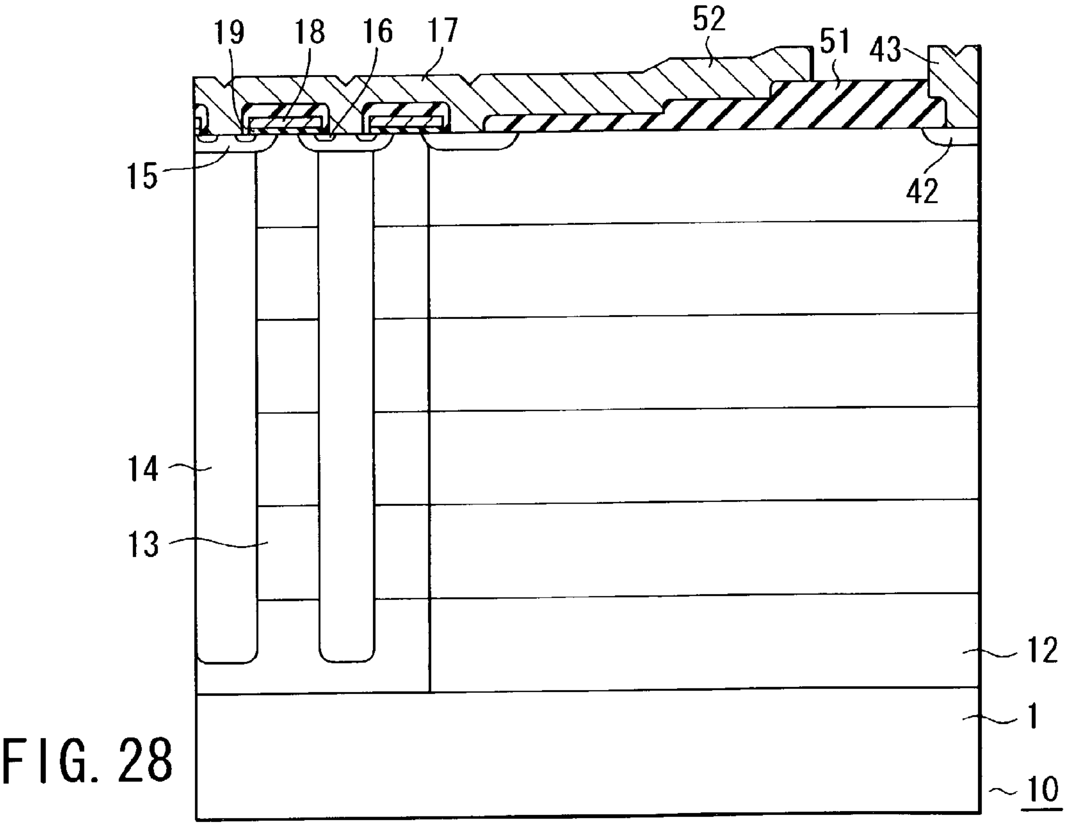
FIG. 28 is a diagram showing the sectional structure of the semiconductor device in FIG. 27.

FIG. 27 shows the planar structure of a semiconductor device according to the fifth embodiment of the present invention. FIG. 28 shows the sectional structure of a portion of the semiconductor device taken along the line XXVIII—XXVIII in FIG. 27. As shown in FIGS. 27 and 28, an insulating film 51 with an appropriate number of (in FIG. 28, three, for example) steps is formed in the terminal area of the semiconductor device and on the surface of the second semiconductor substrate 2. The height of each step of the insulating film increases toward the terminal of the semiconductor device. A field plate electrode 52 extends on the insulating film 51. The field plate electrode 52 is connected to the source electrode 17 or the gate electrode 18 (in FIG. 28, it is connected to the source electrode 17). An end of the field plate electrode 52 is arranged on, for example, a portion of the insulating film 51 which is highest. The number of steps of the insulating film 51 is not limited to three. Furthermore, the insulating film 51 may be inclined instead of having the steps.

According to the fifth embodiment, the second semiconductor substrate 2 and the first and second diffusion layers 13 and 14 are structured similarly to the first to fourth embodiments. The fifth embodiment thus produces effects similar to those of the first to fourth embodiments.

Moreover, according to the fifth embodiment, the insulating film 51, which is thicker toward the end of the semiconductor device, is formed on the surface of the second semiconductor substrate 2. Further, the field plate electrode 52, connected to the source electrode 17 or the gate electrode 18, is formed on the insulating film 51. Thus, electric fields concentrate in a thicker part of the insulating film 51 which is located closer to the end of the field plate electrode 52. The insulating film has a higher withstand voltage than the semiconductor substrate such as silicon, thus serving to provide a semiconductor device having a high withstand voltage as a whole.

(Sixth Embodiment)

As described above, for a semiconductor device in which a semiconductor layer (corresponding to the second semiconductor substrate 2 in the present embodiments) provided with N and P type diffusion layers has a high concentration, measures are required in order to sufficiently form a depletion layer extending to the terminal of the semiconductor device. One possible method for this purpose is to form an impurity diffusion layer in the semiconductor layer which does not function as a MISFET.

Figure 29:
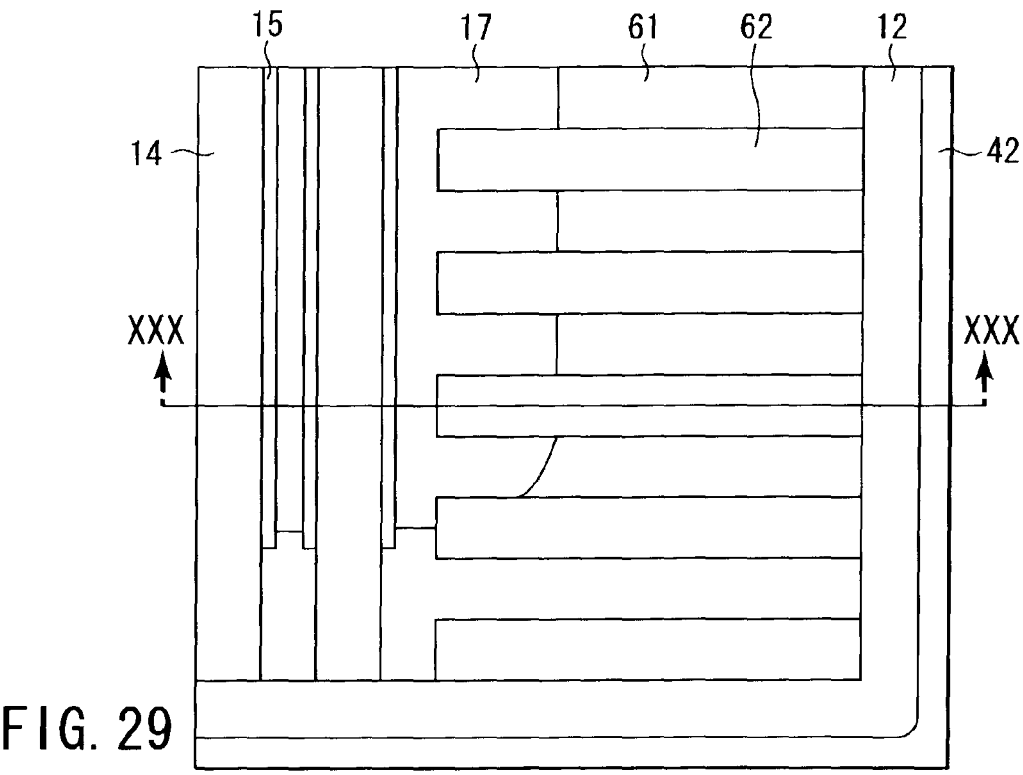
FIG. 29 is a diagram showing the planar structure of a semiconductor device according to a sixth embodiment of the present invention.
Figure 30:
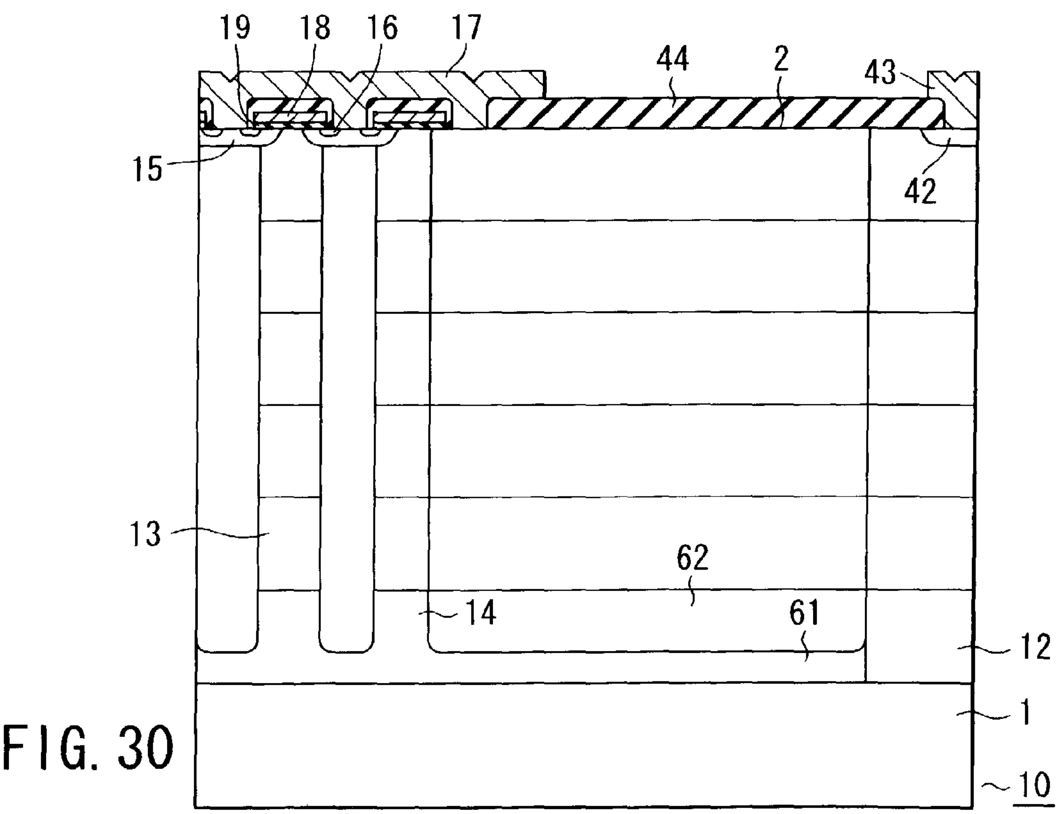
FIG. 30 is a diagram showing the sectional structure of the semiconductor device in FIG. 29.

FIG. 29 shows the planar structure of a semiconductor device according to a sixth embodiment of the present invention. FIG. 30 shows the sectional structure of a portion of the semiconductor storage device taken along the line XXX—XXX. As shown in FIGS. 29 and 30, substantially linear third diffusion layers 61 and fourth diffusion layers 62 are formed in the second semiconductor substrate 2. The third diffusion layers 61 are of the N type, while the fourth diffusion layers 62 are of the P type. The third diffusion layers 61 and the fourth diffusion layers 62 reach, for example, the $N^-$ drain area 12 located at an end of the semiconductor substrate 10 and are alternately formed. The third and fourth diffusion layers 61 and 62 may be formed in a steps in which the first and second diffusion layers 13 and 14 are formed at the same time. Accordingly, the third and fourth diffusion layers 61 and 62 are configured substantially similarly to the first and second diffusion layers 12 and 13.

In the terminal area of a semiconductor device configured as described above, depletion layers are formed along the junctions between the third diffusion layers 61 and the fourth diffusion layers 62. Accordingly, in the planar breadthwise direction and a depth direction of the semiconductor substrate, depletion layers are formed so as to correspond to the positions at which the third and fourth diffusion layers 61 and 62 are formed. In this regard, the planar shapes of the third and fourth diffusion layers 61 and 62 (the shapes in FIG. 29) are determined according to the positions at which depletion layers are to be formed. These planar shapes are not limited to those shown in FIG. 29.

Now, the effects of the sixth embodiment will be described. In the present embodiments, which allow the maintenance of impurity concentration of the second semiconductor substrate 2 at a low level, a common structure such as the one shown in the fourth and fifth embodiments is used to obtain the desired withstand voltage. However, if such a method still fails to form depletion layers to a sufficient extent, the sixth embodiment can be effectively applied.

Furthermore, the impurity concentration of the second semiconductor substrate 2 can be reduced, so that the concentration of impurities can be controlled more easily than in the case in which impurity diffusion layers are formed in a semiconductor substrate with a high impurity concentration.

According to the sixth embodiment, the second semiconductor substrate 2 and the first and second diffusion layers 13 and 14 are structured similarly to the first to fourth embodiments. The sixth embodiment thus produces effects similar to those of the first to fourth embodiments.

According to the sixth embodiment, furthermore, the third and fourth diffusion layers 61 and 62, which are used to form depletion layers, are formed inside the second semiconductor substrate 2 with a low impurity concentration. Thus, the third and fourth diffusion layers 61 and 62 can be formed easily and depletion layers can be formed to a larger extent, which serves to provide a semiconductor device with a high withstand voltage.

Further, the third and fourth diffusion layers 61 and 62 can be formed when the first and second diffusion layers 13 and 14 are formed at the same time. Therefore, a semiconductor device with a high withstand voltage can be obtained by fewer manufacturing steps than ones in the fourth and fifth embodiments.

(Seventh Embodiment)

A seventh embodiment relates to a variation of the sixth embodiment.

Figure 31:
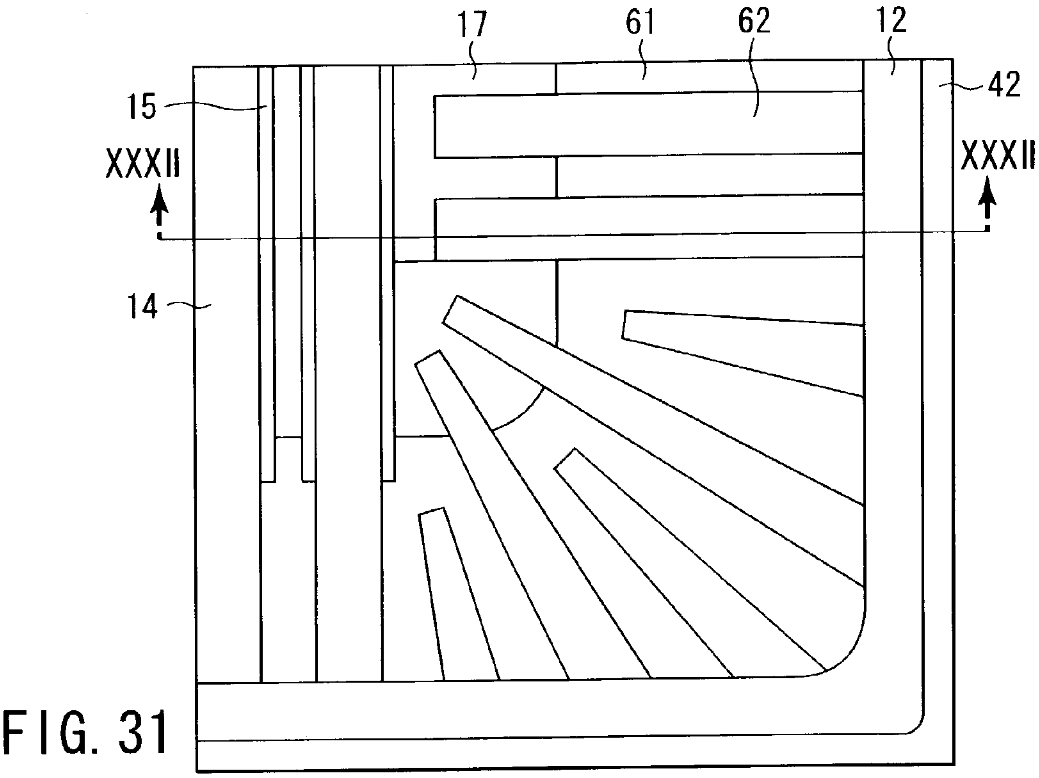
FIG. 31 is a diagram showing the planar structure of a semiconductor device according to a seventh embodiment of the present invention.
Figure 32:
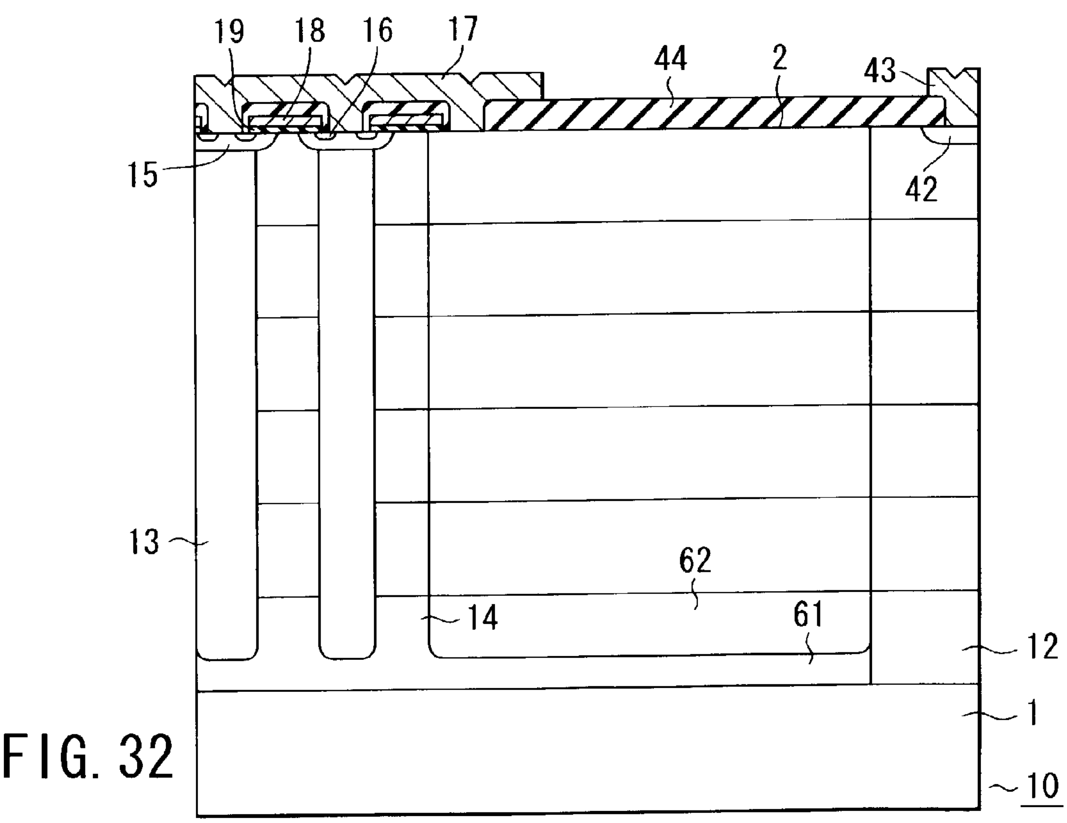
FIG. 32 is a diagram showing the sectional structure of the semiconductor device in FIG. 31.

FIG. 31 shows the planar structure of a semiconductor device according to the seventh embodiment of the present invention. FIG. 32 shows the sectional structure of a portion of the semiconductor device taken along the line XXXII—XXXII in FIG. 31. As shown in FIGS. 31 and 32, the fourth diffusion layers 62 are formed in the respective third diffusion layers 61 in the terminal area, for example, so as to radiate from the center of the semiconductor device.

The third and fourth diffusion layers 61 and 62 are formed to meet the following equation:

$$0.5<(S1\times Qd1)/(S2\times Qd2)<1.5 \quad (3)$$

where Qd1: dose of impurities used when ions are injected to form the third diffusion layers 61, Qd2: dose of impurities used when ions are injected to form the fourth diffusion layers 62, S1: area in which ions are injected to form the third diffusion layers 61, and S2: area in which ions are injected to form the fourth diffusion layers 62.

Figure 33:
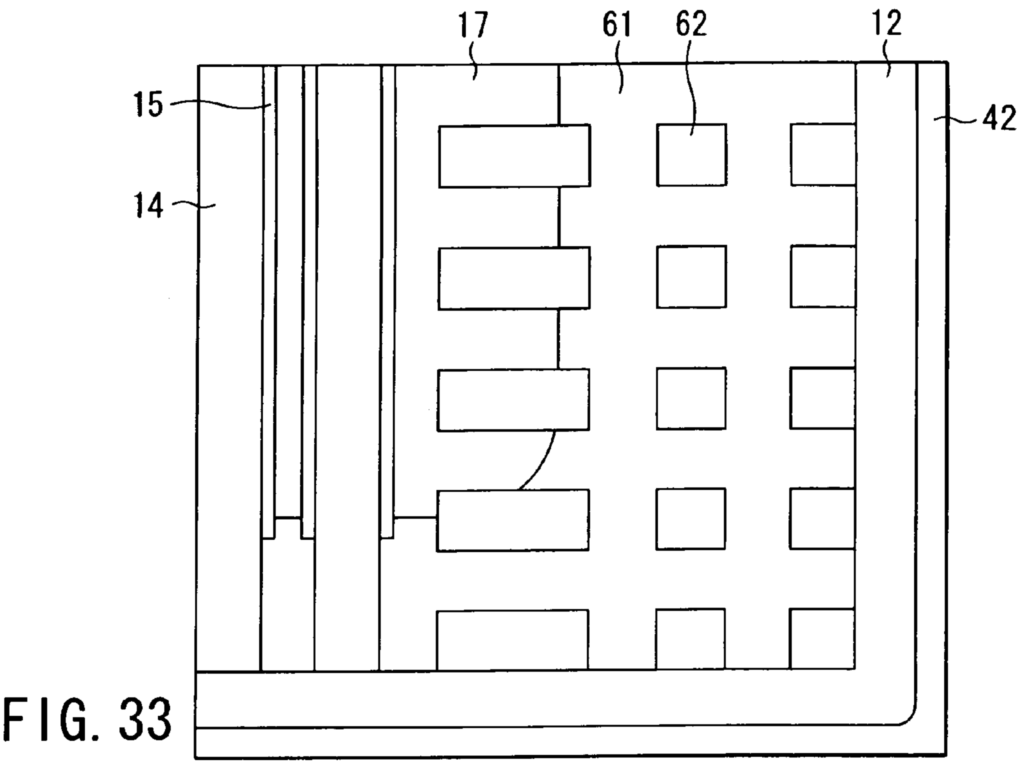
FIG. 33 is a diagram showing the planar structure of a semiconductor device according to a variation of the seventh embodiment of the present invention.

By forming the third and fourth diffusion layers 61 and 62 so as to meet Equation (3), depletion layers are extended far from the junctions between the diffusion layers 61 and the diffusion layers 62. Thus, the third and fourth diffusion layers 61 and 62 may be formed, for example, like a lattice as shown in FIG. 33 as long as the Equation (3) is met. This lattice shape need not lie along the edges of the semiconductor device but may extend at an appropriate angle from them.

According to the seventh embodiment, the second semiconductor substrate 2 and the first and second diffusion layers 13 and 14 are structured similarly to the first to fourth embodiments. The seventh embodiment thus produces effects similar to those of the first to fourth embodiments.

Furthermore, according to the seventh embodiment, the third and fourth embodiments 61 and 62, used to form depletion layers, are formed radially or like a lattice under the predetermined conditions. Depletion layers can be formed to a large extent in the terminal area. This serves to provide a semiconductor device with a high withstand voltage.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:

a semiconductor layer of a first conductive type;

a first diffusion area of the first conductive type formed in the semiconductor layer, the first diffusion area being defined by a first concentration profile of first impurities of the first conductive type and a second concentration profile of second impurities of a second conductive type; and a second diffusion area of the second conductive type formed in the semiconductor layer, the second diffusion area being defined by the first concentration profile and the second concentration profile, a junction between the first diffusion area and the second diffusion area being formed where a concentration of the first impurities and a concentration of the second impurities are same, the second concentration profile being formed by combining a plurality of concentration profiles of a plurality of impurity diffusion areas, the second diffusion area in the planar direction having a width less than half a maximum diffusion width of one of the plurality of impurity diffusion areas.

2. The device according to claim 1, wherein the concentration of the first impurities in 50% to 65% of a width of the first diffusion area is equal to or greater than 50% of a peak concentration of the first impurities of the first diffusion area.

3. The device according to claim 2, wherein the concentration of the second impurities in 50% to 65% of the width of the second diffusion area is equal to or greater than 50% of a peak concentration of the second impurities of the second diffusion area.

4. The device according to claim 1, comprising plural of said first and second diffusion areas, wherein the second diffusion areas sandwich the first diffusion areas, and a pitch of the first diffusion areas sandwiched by the second diffusion areas is between 6 and 18 μm.

5. The device according to claim 1, wherein the semiconductor layer has a first semiconductor layer and a second semiconductor layer on the first semiconductor layer, the first diffusion area has a first diffusion region in the first semiconductor layer and a second diffusion region, which is connected to the first diffusion region, in the second semiconductor layer, and the second diffusion area has a third diffusion region in the first semiconductor layer and a fourth diffusion region, which is connected to the third diffusion region, in the second semiconductor layer.

6. The device according to claim 5, wherein the junction between the first diffusion area and the second diffusion area is substantially linear.

7. The device according to claim 1, wherein the impurity concentration of the semiconductor layer is equal to or lower than one-fifth of that of the first diffusion area or the second diffusion area.

8. The device according to claim 7, wherein the first diffusion area has a function of forming a current path in the semiconductor device, the first diffusion area is spaced from an end of the semiconductor layer so as to form a terminal region between the first diffusion area and the end of the semiconductor layer.

9. The device according to claim 8, further comprising a third diffusion area of the second conductive type formed, in the end region, on a surface of the semiconductor layer so as to surround a MISFET element.

10. The device according to claim 8, further comprising:

a base area of the second conductive type formed in a surface of the semiconductor layer and connected to the second diffusion area;

a source area of the first conductive type formed in the base area;

a source electrode provided on the surface of the semiconductor layer and covering a part of the source area;

a gate electrode provided on the surface of the semiconductor layer with a gate insulating film interposed therebetween and covering a part of the base area, source area, and first diffusion area;

an insulating film provided, in the end region, on the surface of the semiconductor layer, the insulating film having a height increasing toward the end of the semiconductor layer; and a first electrode formed on the insulating film and connected to the source electrode or the gate electrode.

11. The device according to claim 8, further comprising an impurity area formed in the end region and forming a depletion layer in the end region.

12. The device according to claim 11, wherein the impurity area has a fourth diffusion area and a fifth diffusion area having substantially the same structure as the first and second diffusion areas, respectively.

13. The device according to claim 12, wherein the following relation is satisfied:

$$0.5<(S\mathbf{1}\times Qd\mathbf{1})/(S\mathbf{2}\times Qd\mathbf{2})<1.5$$

Qd1: dose of impurities used when ions are injected to form the fourth diffusion area, Qd2: dose of impurities used when ions are injected to form the fifth diffusion area, S1: area in which ions are injected to form the fourth diffusion area, and S2: area in which ions are injected to form the fifth diffusion area.

14. The device according to claim 12, wherein the fourth and fifth diffusion areas are substantially linear in the plane of the semiconductor layer.

15. The device according to claim 12, wherein the fourth and fifth diffusion areas are substantially radial in the plane of the semiconductor layer.

16. The device according to claim 12, wherein the fourth diffusion area is placed in a lattice pattern in the plane of the semiconductor layer between the fifth diffusion areas.

* * * * *